United States Patent [19]

Takano et al.

[11] Patent Number: 5,012,673
[45] Date of Patent: May 7, 1991

[54] METHOD AND APPARATUS FOR DETECTING A ROTATION ANGLE

[75] Inventors: Yoshiya Takano, Katsuta; Yoshikazu Hoshi, Ibaraki, both of Japan

[73] Assignee: Hitachi, Ltd., Tokyo, Japan

[21] Appl. No.: 176,087

[22] Filed: Apr. 1, 1988

[30] Foreign Application Priority Data

Apr. 30, 1987 [JP] Japan ................................. 62-80970
Jun. 30, 1987 [JP] Japan ................................ 62-161191

[51] Int. Cl.⁵ ................................. G01M 15/00
[52] U.S. Cl. ................................. 73/118.1; 307/515; 377/19
[58] Field of Search ................. 377/2, 19, 17, 26, 45; 307/309, 514, 515, 516; 73/118.1; 250/231 SE

[56] References Cited

U.S. PATENT DOCUMENTS

| | | | |
|---|---|---|---|
| 2,926,333 | 2/1960 | Bower | 377/17 |
| 4,016,432 | 4/1977 | Marzalek | 307/514 |
| 4,201,911 | 5/1980 | Dering | 250/231 SE |
| 4,267,470 | 5/1981 | Kawakami et al. | 307/515 |
| 4,421,980 | 12/1983 | Kuhne | 250/231 SE |
| 4,633,224 | 12/1986 | Gipp et al. | 250/231 SE X |
| 4,698,828 | 10/1987 | Hiramoto | 377/45 |
| 4,733,177 | 3/1988 | Pawletko | 307/309 |

FOREIGN PATENT DOCUMENTS 0851780 8/1981 U.S.S.R. ................. 377/45
2044463 10/1980 United Kingdom ......... 307/515

Primary Examiner—Jerry W. Myracle
Attorney, Agent, or Firm—Antonelli, Terry, Stout & Kraus

[57] ABSTRACT

A measurement range is divided into a plurality of sections, a binary coded signal is generated at each division point, small section signals are generated at a predetermined interval between the binary coded signals, the binary coded signals are weighted by angles, and the small section signals are added or subtracted to or from the weighted signal to interpolate between two binary coded signals. Since the increment signals generated between the adjacent absolute signals is used as an interpolation signal between the absolute signals, the measurement accuracy is enhanced without increasing the number of elements for generating the absolute signals. The measured angle can be accurately read by adding or subtracting the increment signals to and from the weighted signal of the absolute signal.

9 Claims, 26 Drawing Sheets

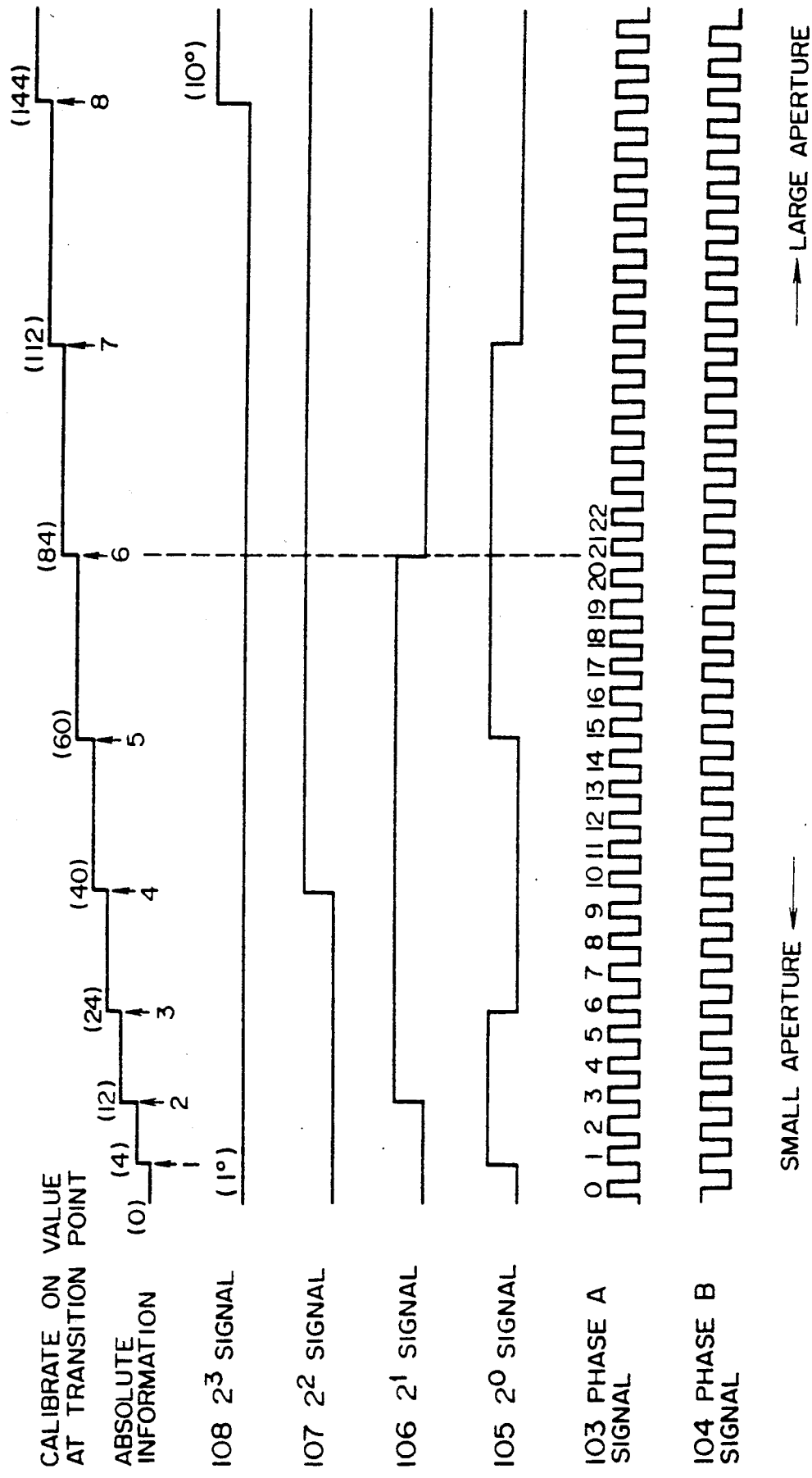

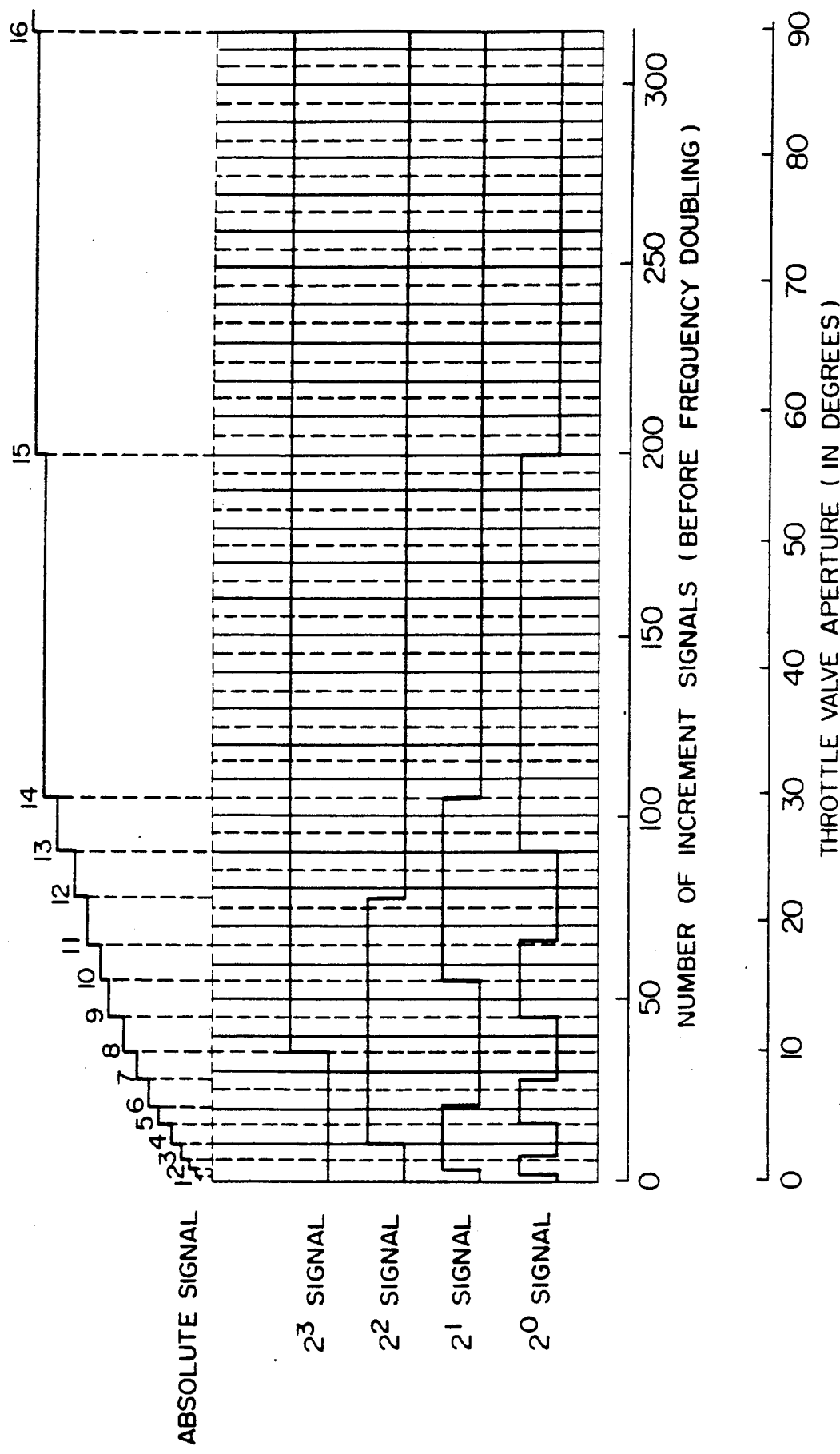
FIG. IB

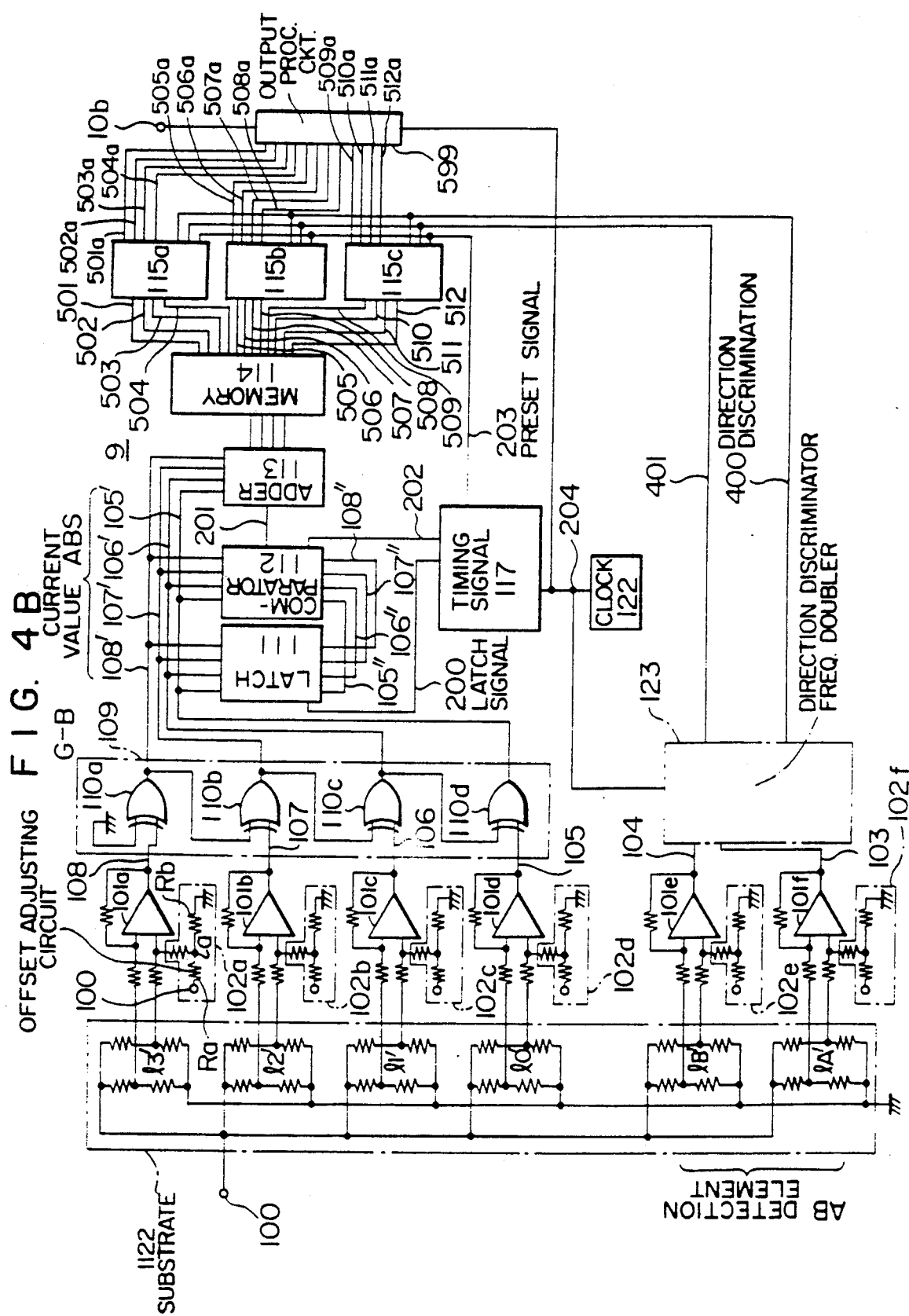

F I G. 7
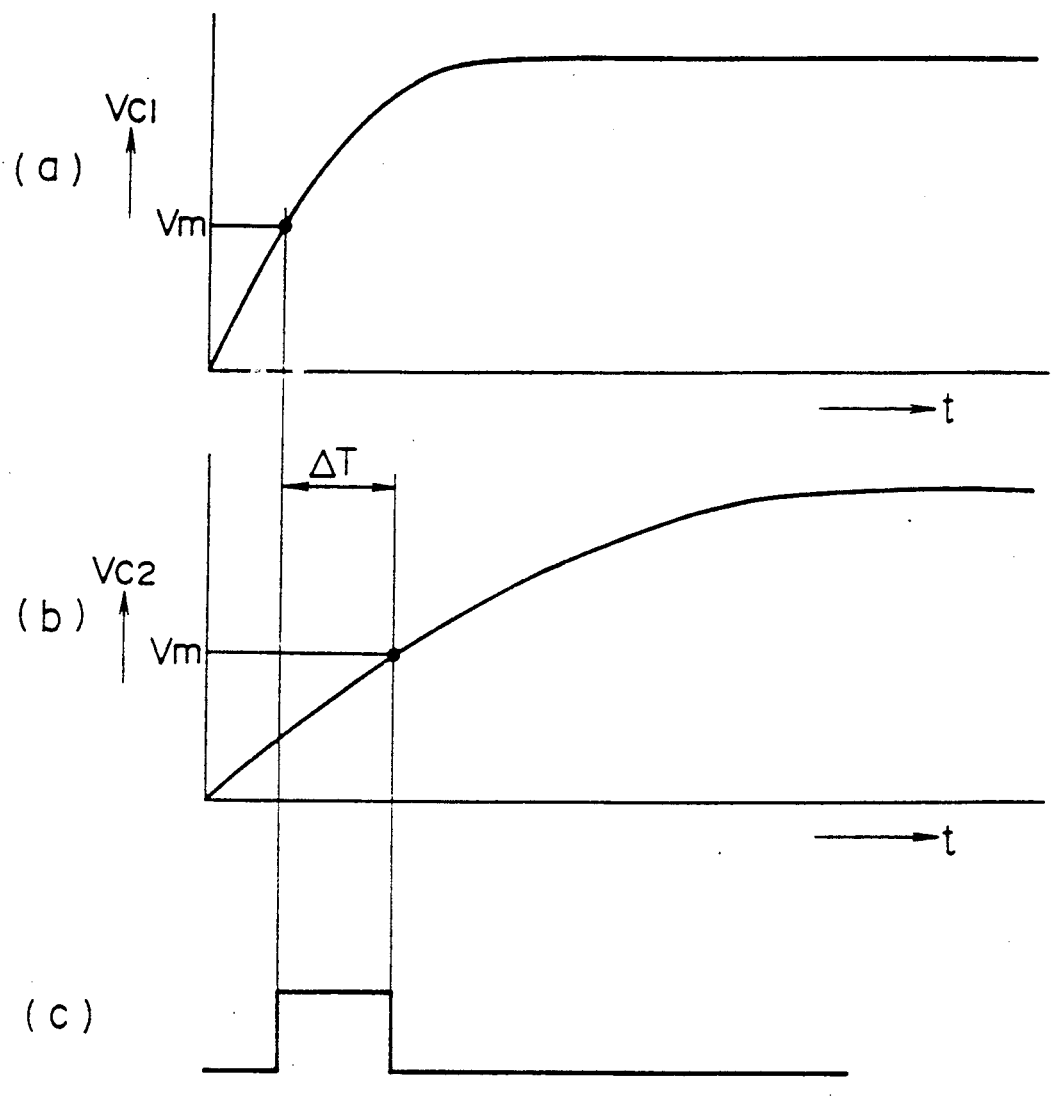
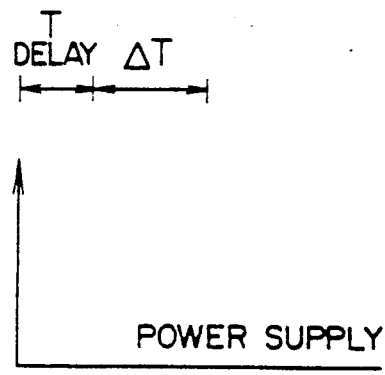

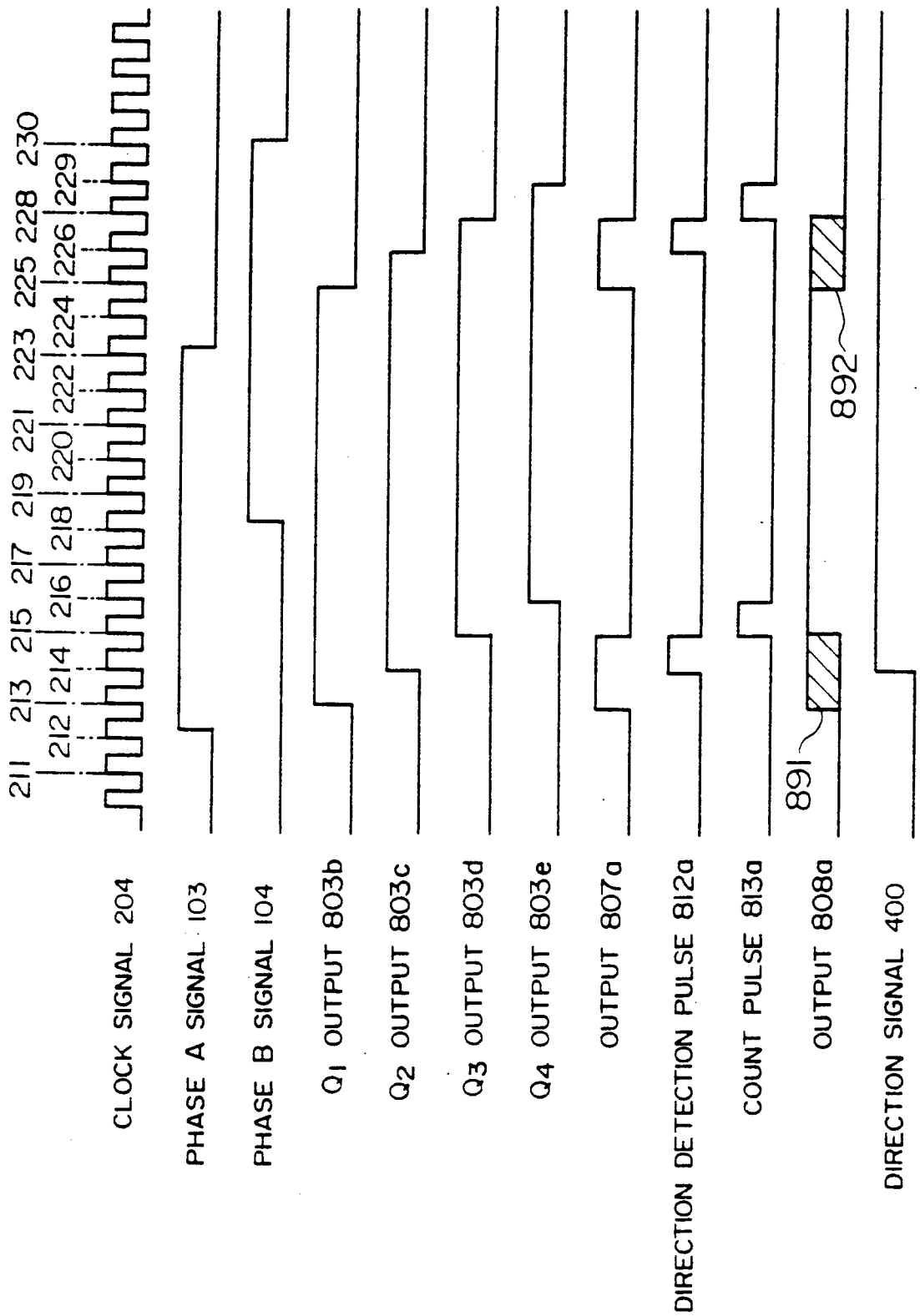

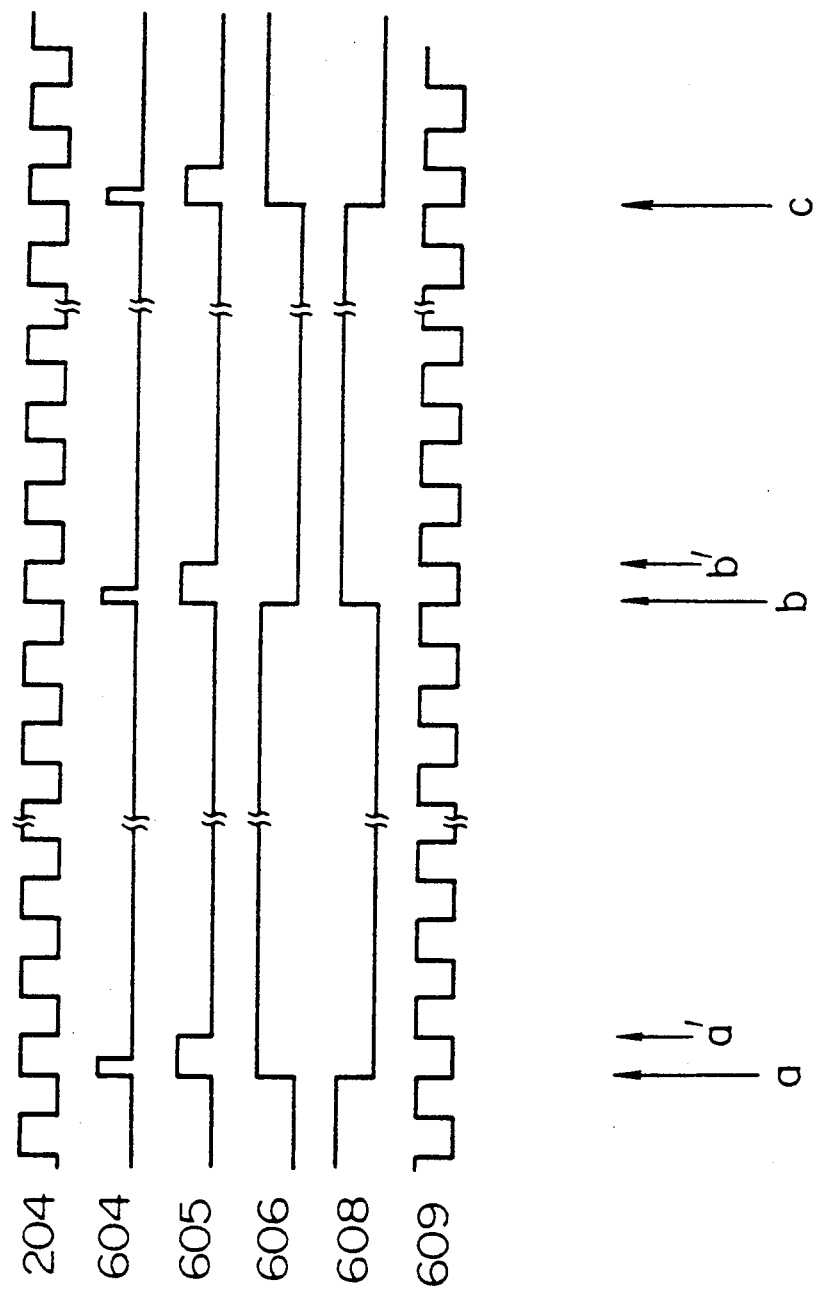

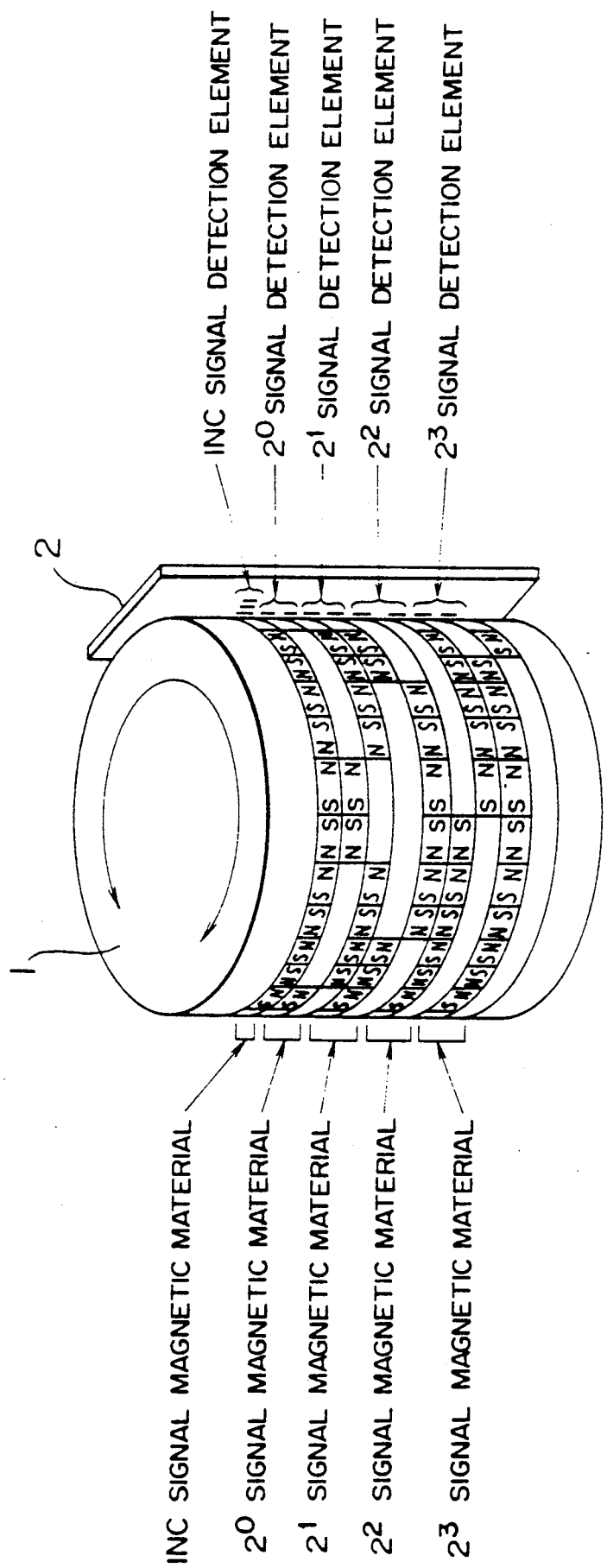

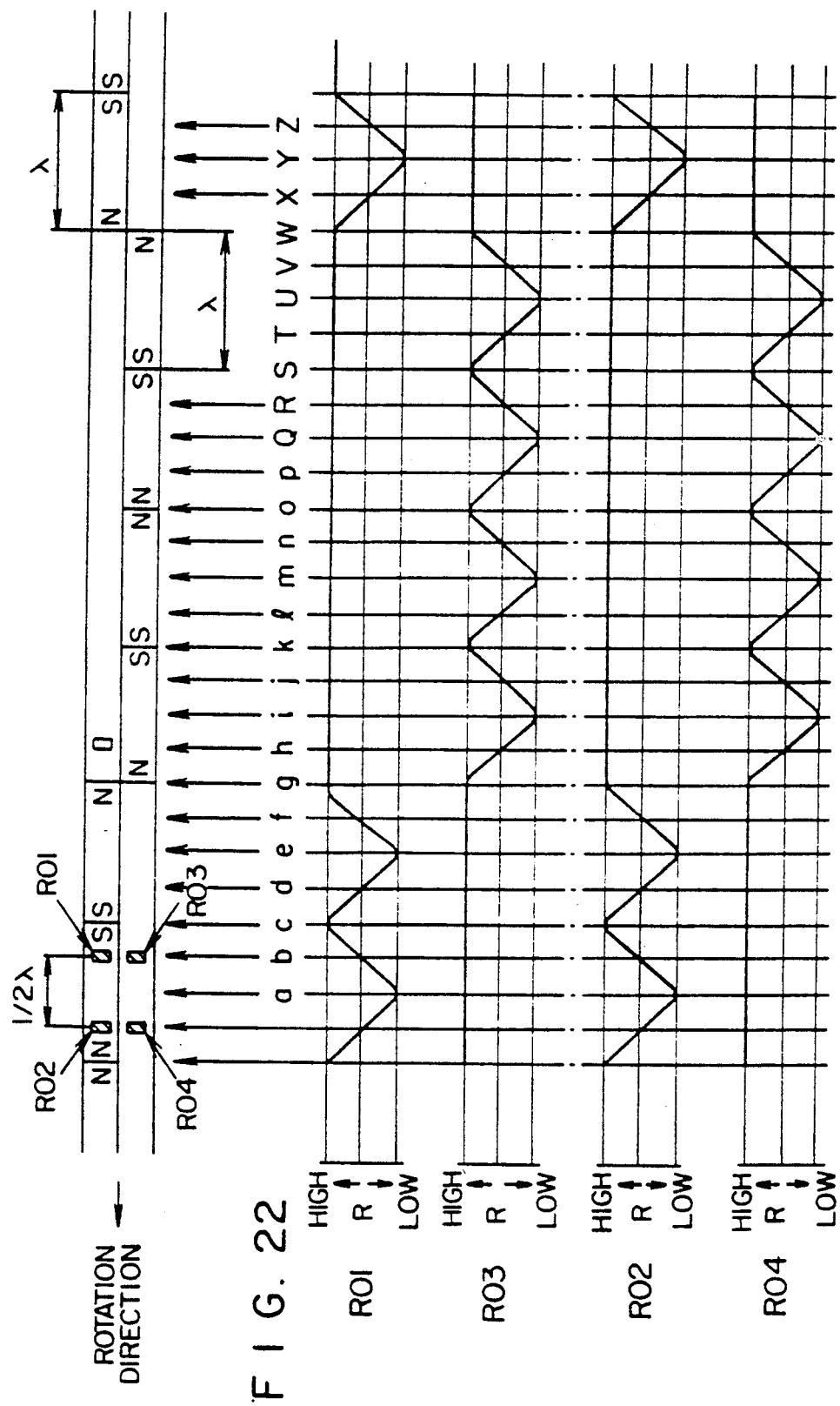

METHOD AND APPARATUS FOR DETECTING A ROTATION ANGLE

BACKGROUND OF THE INVENTION

The present invention relates to a method and apparatus for detecting a rotation angle, and more particularly to an angle detection method and apparatus for outputting an absolute value signal representing a measured rotation angle.

An angle detection method and apparatus for outputting an absolute value signal representing measured rotation angle have been disclosed in JP-A-58-47212.

In the disclosed angle detection method and apparatus, patterns of a plurality of channels are formed with a slight rotation angle deviation from each other so that a combination of patterns of the respective channels corresponds to a predetermined angle, and the angle is detected as a specific binary coded signal. Where a fine signal is required, a parallelly arranged increment type detector is activated to detect a fine angle.

In the above prior art technique, if there are five channels, $2^5=32$ combinations of patterns are possible. Accordingly, an angular measurement range (360 degrees in the prior art technique) is divided into 32 sections such that a first section has 360/32 degrees, a second section has 360/32 degrees x 2, a third section has 360/32 degrees ×3, -----, an n-th section has 360/31 degrees ×n (where n is an integer between 1 and 32). In this manner, specific angles are allotted to 32 binary codes and the angles may be detected as 32 absolute values.

In this arrangement, however, if an absolute signal for every one degree is needed, 360 combinations of patterns are required. To this end, at least ten channels are required, and hence a large scale of sensors are required.

When a fine angle signal is produced by activating the parallelly arranged increment type detector, an absolute value signal is not produced.

SUMMARY OF THE INVENTION

It is an object of the present invention to provide an angle detection method and apparatus for detecting a fine angle by an absolute value signal without increasing the size of the sensor.

The above object is achieved by parallelly arranging an absolute type angle detector and an increment type angle detector and adjusting an absolute value signal in accordance with an output signal of the increment type angle detector to produce an interpolation signal between the measurements of the absolute type angle detector.

The above object is further achieved by dividing a range of measurement into a plurality of sections, generating a specific binary coded signal at each division point, generating sub-section signals at a predetermined interval between different specific binary coded signals, weighting the respective binary coded signals in accordance with the angles, and adjusting the sub-section signals for the weighted signals to interpolate between the two different binary coded signals.

In accordance with the present invention, since the increment signals generated between the adjacent absolute signals are used as the interpolation signals between the absolute signals, it is possible to enhance the measurement precision without increasing the number of absolute signal generation elements.

By weighting the absolute signals and adjusting the increment signals for the weighted signals, the measured angle can be directly read with a high precision.

For example, when the absolute type detector generates 30 binary coded signals over the 360-degrees range of measurement, the section from the initial position to the next binary coded signal position is given by the absolute signal representing the initial position and the interpolation signal generated at the pitch of a quotient of 360 degrees/30 = 12 degrees divided by the number of increment signals. If 360 increment signals are generated at a constant interval over the entire range of measurement, the number of interpolation signals between the binary coded signals is 360/30. Accordingly, the increment type detector generates 12 interpolation signals between the initial position and the next binary coded signal generation. When the detector stops at the angle 10 degrees, the output of the absolute type detector is "1", and the output of the increment type detector is "10". Those two outputs are combined to recognize "1" plus "10" as the angle 10 degrees. Similarly, when the detector stops at the angle 90 degrees, the output of the absolute type detector is "7" and the output of the increment type detector is "6". Those outputs are combined to recognize "7" plus "6" as the angle 90 degrees.

The increment signal may be frequency-divided to convert it to sub-section signals. Thus, an angle smaller than one degree may be detected.

It is effective to weight the absolute signal by a real angle and add the count of the increment signal thereto. For example, the first absolute signal is weighted by 12 degrees. By adding to or subtracting from 12 degrees the count of the increment signal, the result represents the absolute value of the rotation angle of the detector.

BRIEF DESCRIPTION OF THE DRAWINGS

FIGS. 1A and 1B show waveforms of signals generated in one embodiment of the present invention, FIG. 7 illustrates an operation of the signal processing circuit.

FIG. 8B shows operational waveforms thereof,

FIG. 10 shows a time chart of the signal processing circuit of FIG. 9,

FIGS. 15 to 24 illustrate a principle of detection and operations of the magneto-resistive element.

DESCRIPTION OF THE PREFERRED EMBODIMENTS

Before the explanation of configuration and operation of an embodiment of the present invention, a principle of detection of an absolute signal and an increment signal by a magneto-resistive element which is detection means in the embodiment is explained.

Figure 15A:
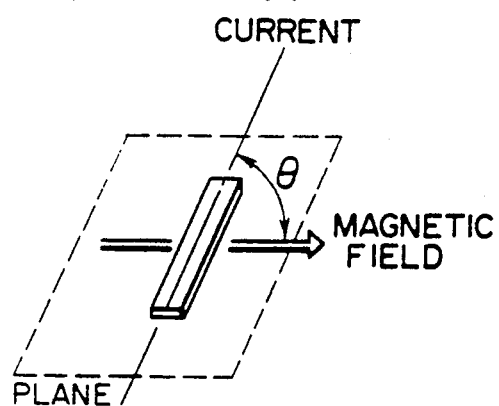
Figure 15B:
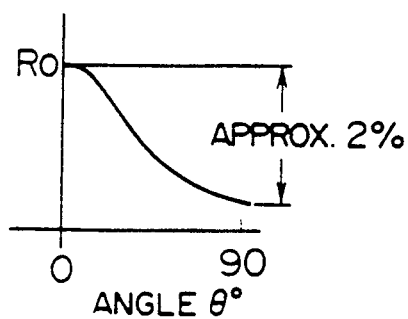
Figure 15C:
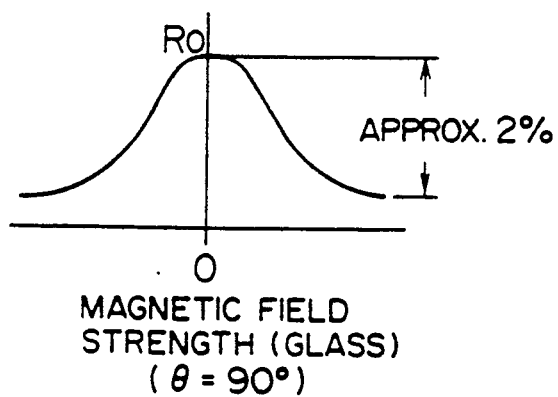

FIG. 15 shows a change in a resistance of the magneto-resistive element with a magnetic field. FIGS. 15A and 15B show changes in the resistance of the magneto-resistive element with an angle $\theta$ between a current flowing through the element and a magnetic field on the same plane. When $\theta=0$ degree, the resistance is an initial value Ro, and when $\theta=90$ degrees, it reduces by approximately 2%. FIG. 15C shows a change in the resistance to a magnetic field strength when $\theta=90$ degrees. By applying the magnetic field, the initial resistance Ro is again reduced by approximately 2%.

In the principle of detection of the present embodiment, the signal is detected by the change in the resistance caused by the magnetic field applied to the magneto-resistive element.

Figures 17, 18:
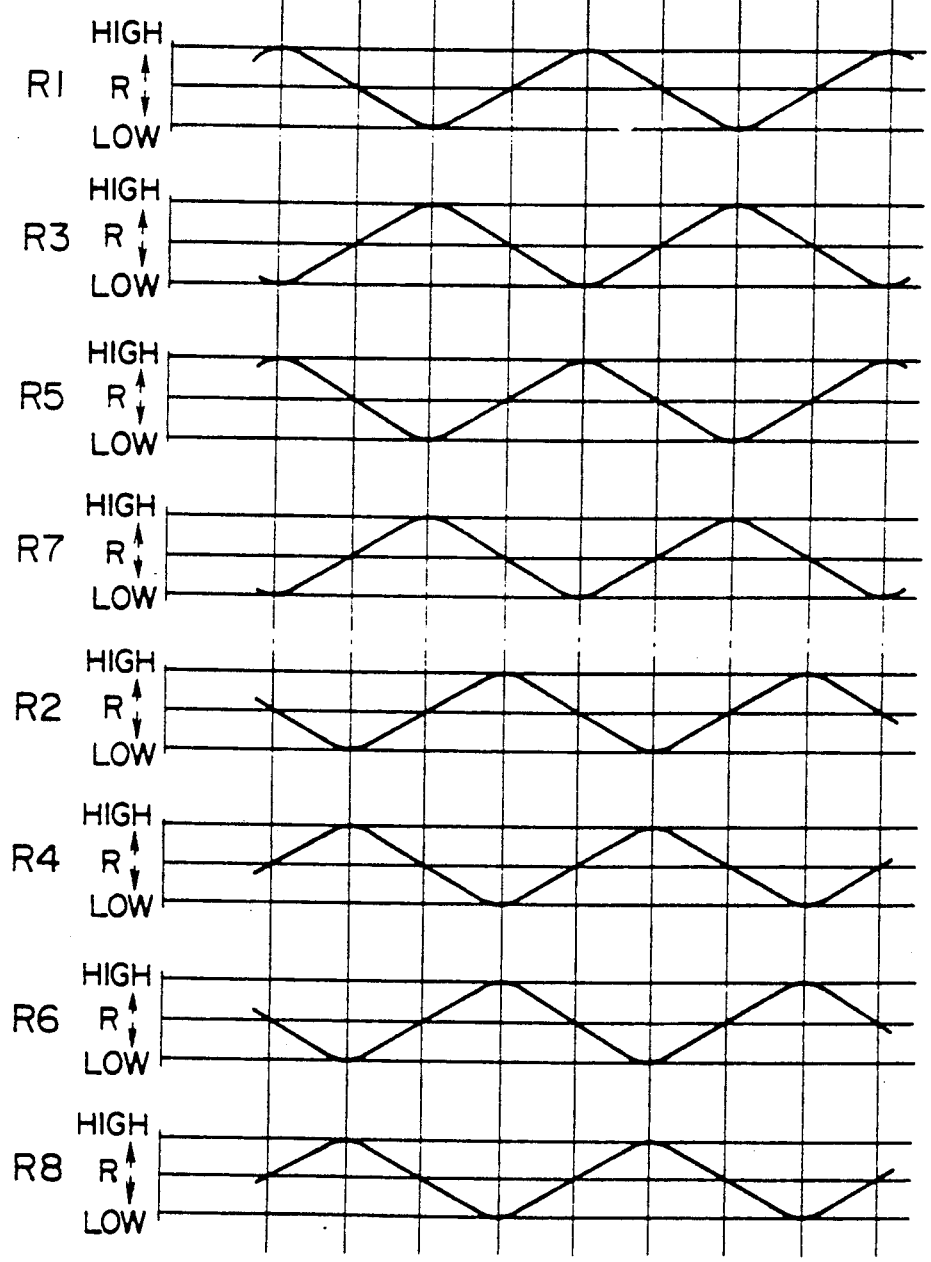

Referring to FIGS. 16, 17 and 18, the increment signal to be detected by the magneto-resistive element is explained.

FIG. 16 shows an arrangement of the magnetic material and the magneto-resistive member. The magnetic material is formed on an outer periphery of a drum 1 rotated by a rotation force, and the magneto-resistive element formed on a substrate 2 is arranged to face the drum 1 with a predetermined spacing from the outer periphery of the drum 1.

FIG. 17 shows a developed view of the increment signal magnetic materials of the drum 1 and the facing magneto-resistive element. The magnetic materials are arranged with the poles of same polarity facing each other. Elements R1-R8 are arranged at an interval of $\lambda/4$, where $\lambda$ is a unit.

Numerals 1 - 9 indicate positions of the magnetic materials. In FIG. 18, "High R" indicates that the resistance of the element is maximum, that is, non-application of the magnetic field, and "Low R" indicates that the resistance has been reduced by approximately 2% by the application of the magnetic field.

When the element R1 is at the position 1, the resistances of the elements assume values shown on the line 1. The element R1 is not affected by the magnetic field and exhibits "High R", the element R3 is most strongly affected by the magnetic field and the resistance thereof is reduced by approximately 2% ("Low R"), the element R5 exhibits "High R" as the element R1 does, and the element R7 exhibits "Low R" as the element R3 does.

The elements R2, R4, R6 and R8 are affected by the magnetic field to some extent and show the resistance which is intermediate of "High R" and "Low R".

When the magnetic material rotates by $\lambda/4$ so that the element R1 is at the position 2 of the magnetic material, the elements exhibit the resistances shown on the line 2. The elements R1, R3, R5 and R7 are at the same positions as those of the elements R2, R4, R6 and R8 in the position 1 and exhibit the resistance which is intermediate of "High R" and "Low R". On the other hand, the element R2 is intermediate of N-pole and S-pole and influenced by the magnetic field so that it exhibits "Low R", the element R4 is on the S-pole and not influenced by the magnetic field so that it exhibits "High R", the element R6 exhibits "Low R" as the element R2 does, and the element R8 exhibits "High R" as the element R4 does.

As element R1 is subsequently moved to the positions 3 - 9 sequentially, the resistances of the elements repeat the above states at a period $\lambda$.

As a result, an angle corresponding to the unit $\lambda$ of the magnetic material can be detected as the changes in the resistances of the elements.

Figure 19:
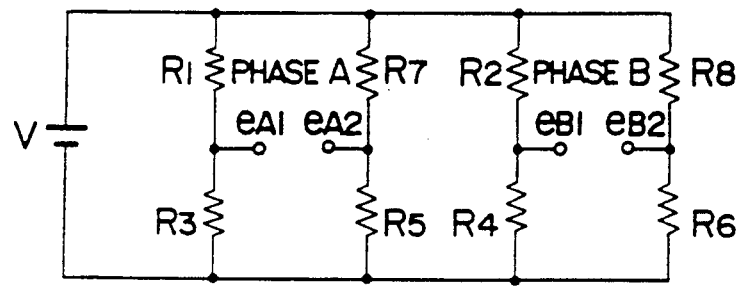

The changes in the resistances of the elements are read as changes in voltages in a bridge circuit shown in FIG. 19. Signals from the elements R1, R3, R5 and R7 are represented by phase A and the signals from the elements R2, R4, R6 and R8 are represented by phase B.

Figure 20:
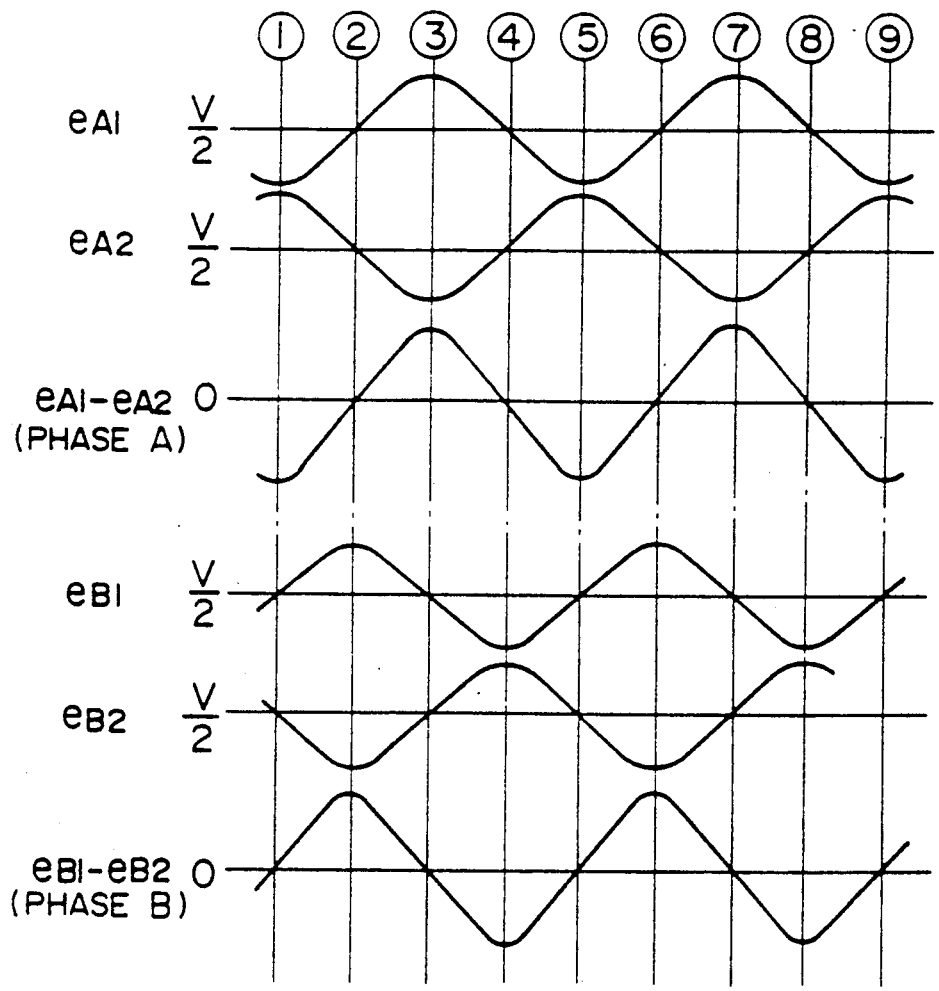

A change in voltage of each bridge is shown in FIG. 20. Numerals 1 - 9 indicate the same positions as those of FIGS. 17 and 18. A voltage at a terminal $e_{A1}$ of the phase A is generated by the changes in the resistances of the elements R1 and R3, a voltage at a terminal $e_{A2}$ is generated by the changes in the resistances of the elements R5 and R7, and the phase A signal is read as a signal $e_{A1} - e_{A2}$. Similarly, the phase B signal is read as a signal $e_{B1} - e_{B2}$.

Accordingly, the phase A signal and the phase B signal have the same period as the magnetic material recording pitch $\lambda$ and a phase difference $\lambda/4$ therebetween. A rotation angle corresponding to the period $\lambda$ of the phase A signal or the phase B signal is a minimum resolution angle signal detected by the magneto-resistive element. Two phases are required in order to discriminate the direction of rotation of the drum 1, as will be explained later.

A rotation angle $\theta$ min corresponding to the magnetic recording pitch $\lambda$ is given by $\theta \min = \pi \cdot D/\lambda$ where D is a diameter of the drum 1.

The absolute signal is now explained. FIG. 21 shows a developed view of portions of a $2^0$ signal magnetic material and a $2^0$ signal detector shown in FIG. 16. An absolute 1 bit magnetic material has two tracks and two detectors are arranged for each of the tracks. A length of each magnetic material is equal to $\lambda$ as it is for the increment signal, and the detectors are arranged at an interval of $\lambda/2$.

FIG. 22 shows changes in resistances of elements RO1, RO2, RO3 and RO4. Resistances of the elements when the element center line (mid-point of a line connecting the elements RO2 and RO4 and a line connecting the elements RO1 and RO3) is at the positions of the magnetic materials a -Z, respectively. "High R" and "Low R" indicate the zero magnetic field status and the 2% resistance reduction status by the influence of the magnetic field, respectively.

When the element center is at the position a, the element RO1 is somewhat influenced by the magnetic field and exhibits an intermediate state between "High R" and "Low R", the element RO2 exhibit the same state, and the elements RO3 and RO4 exhibit "High R" status because of no magnetic field.

When the element center line is at the position f, the element RO1 is at the position g and is not influenced by the magnetic field and exhibits "High R", and the element RO2 is at the position e and most influenced by the magnetic field and exhibits "Low R", and the elements RO3 and RO4 exhibit "High R" because of no facing magnetic material. When the element center line moves to the position g, the element RO1 moves off the facing magnetic field and exhibits "High R", and the element RO3 starts to face the magnetic material and exhibits a state between "High R" and "Low R". The elements R02 and R04 are at the position f and the element R02 exhibits an intermediate between the resistances of the elements R02 and R04, and the element R04 exhibits "High R". As the element center moves to the positions h, i and j, the element RO1 exhibits "High R", "High R" and "High R", respectively, the element R02 exhibits "High R", "High R" and "High R", respectively, the element R03 exhibits "Low R", "Intermediate R" and "High R", respectively, and the element R04 exhibits "High R", "Intermediate R" and "Low R", respectively. The patterns of change in resistance of the elements RO1 and R03 and the elements R02 and R04 change from the positions f and g to other states, respectively.

As the magnetic material further moves to the position V, the elements RO1 and R03 are at the position W and the patterns of change of resistances of the elements R02 and R04 change so that in the same manner as those of the change patterns prior to the positions f and h.

Figure 23:
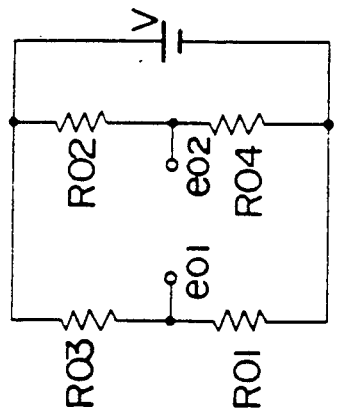

The elements RO1, R02, R03 and R04 having the resistance characteristics described above are wired in a bridge as shown in FIG. 23.

Figure 24:
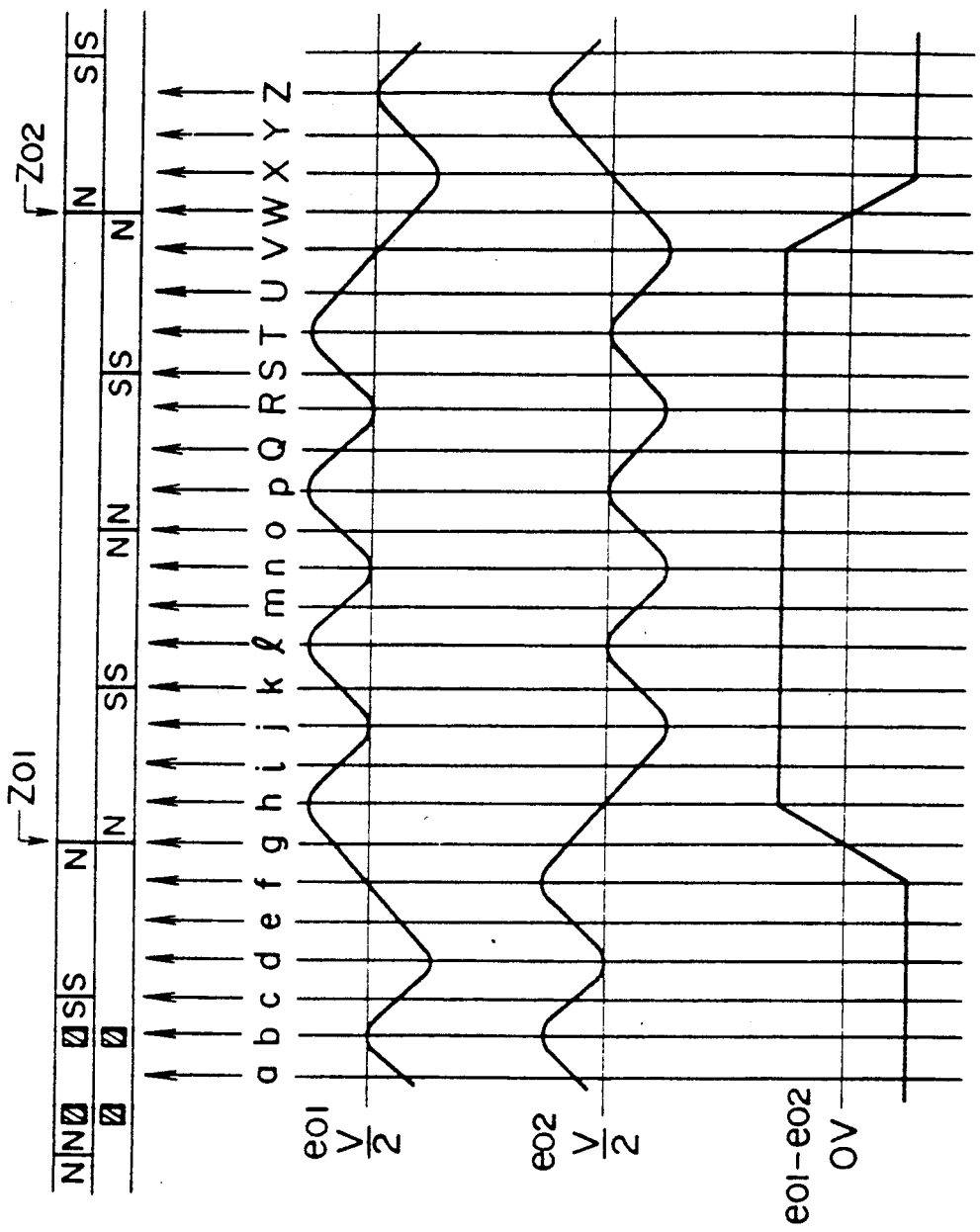

Changes of voltages at terminals $e_{01}$ and $e_{02}$ of the bridge are shown in FIG. 24 in which a -Z correspond to the positions in FIG. 22. The voltage at the terminal $e_{01}$ corresponds to the changes in the resistances of the elements RO1 and R03. For example, at the position e, the element RO1 exhibits the intermediate of "High R" and "Low R" and the element R03 exhibits "High R" and hence the terminal voltage is slightly lower than V/2. At the position f, the elements RO1 and R03 exhibits the same resistance and hence the terminal voltage is V/2. At the position g, the element RO1 exhibits "High R" and the element R03 exhibits the intermediate of "High R" and "Low R" and hence the terminal voltage is higher than V/2. The voltage at the terminal $e_{01}$ changes from lower than V/2 to higher than V/2 at the position f. On the other hand, the voltage at the terminal $e_{02}$ changes from higher than V/2 to lower than V/2 at the position h.

At the terminal $e_{01}$, the voltage status changes at the position V, and at the terminal $e_{02}$, the voltage status changes at the position X. The voltages at the terminals $e_{01}$ and $e_{02}$ are equal at the position g and W.

Accordingly, the potential $e_{01}-e_{02}$ changes from negative to positive at the position g, and from positive to negative at the position W. The positions g and W correspond to transition points Z01 and Z02 of two magnetic material tracks.

The absolute signals of the bits $2^1$, $2^2$ and $2^3$ shown in FIG. 16 are formed in a similar manner. Accordingly, the absolute value is detected based on the bit status. In the 4-bit configuration shown in FIG. 16, 16-step absolute signals may be formed.

As described above, the transition point of the absolute signal is determined by the magnetic material array transition points (Z01 and Z02 in FIG. 24) of the two magnetic material tracks which constitute one bit.

In the two tracks which constitute one bit, the magnetic material is arranged on only one track at one position. On the track facing the elements R04 and R03, one bit of absolute signal is generated only in the section of the unit λ, and no signal is generated in the section in which the magnetic material is arranged on the track facing the elements R02 and R01.

In FIG. 24, one step of absolute change is generated by 4λ or four A or B-phase signals by changing the number of magnetic materials contained between Z01 and Z02, the transition points corresponding to one step of absolute can be changed.

A throttle sensor used to detect a throttle value aperture of an internal combustion engine according to the present invention is explained.

Figure 11A:
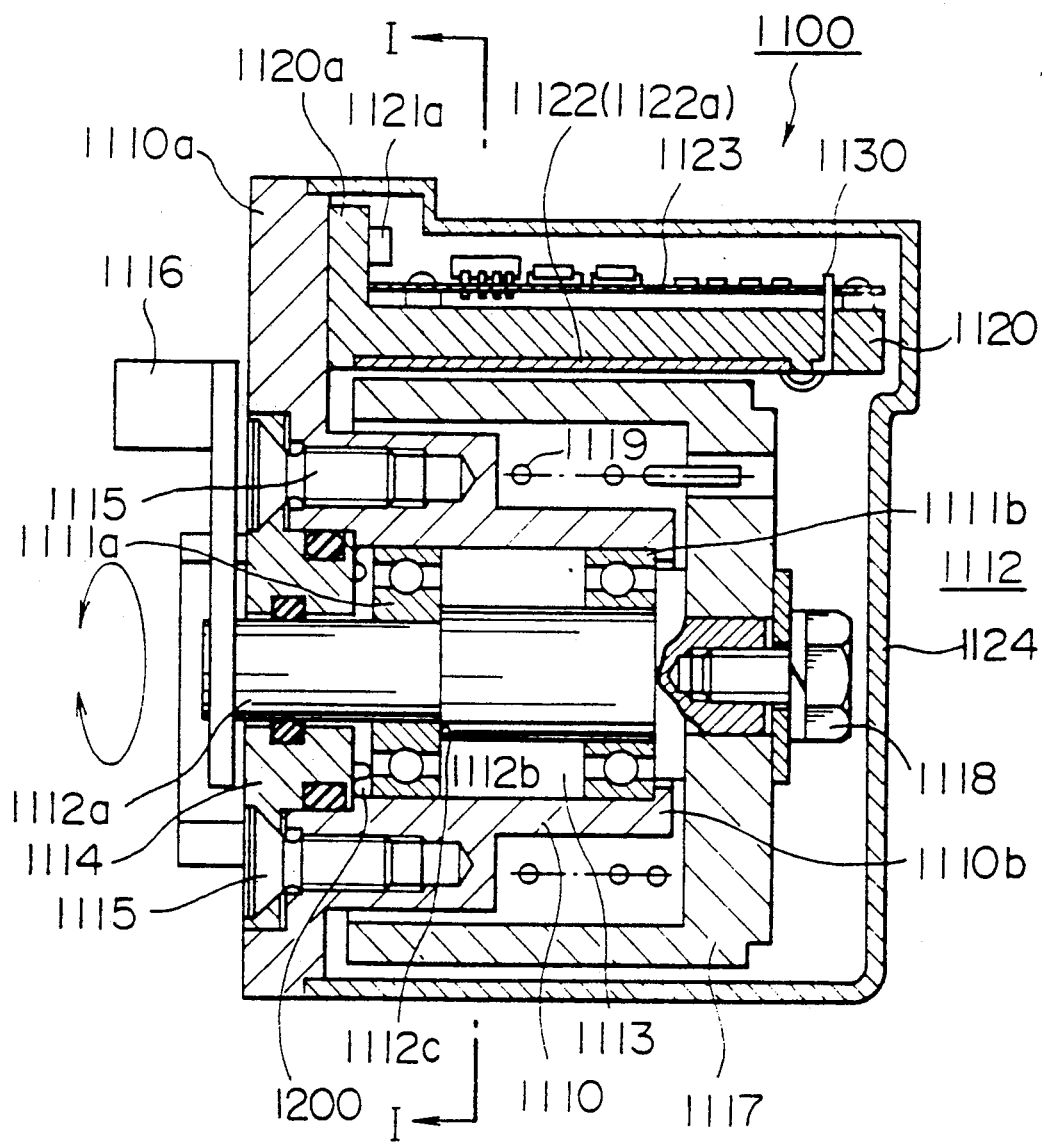
FIGS. 11A-11G show sectional views of a throttle sensor to which one embodiment of the present invention is applied.
Figure 11B:
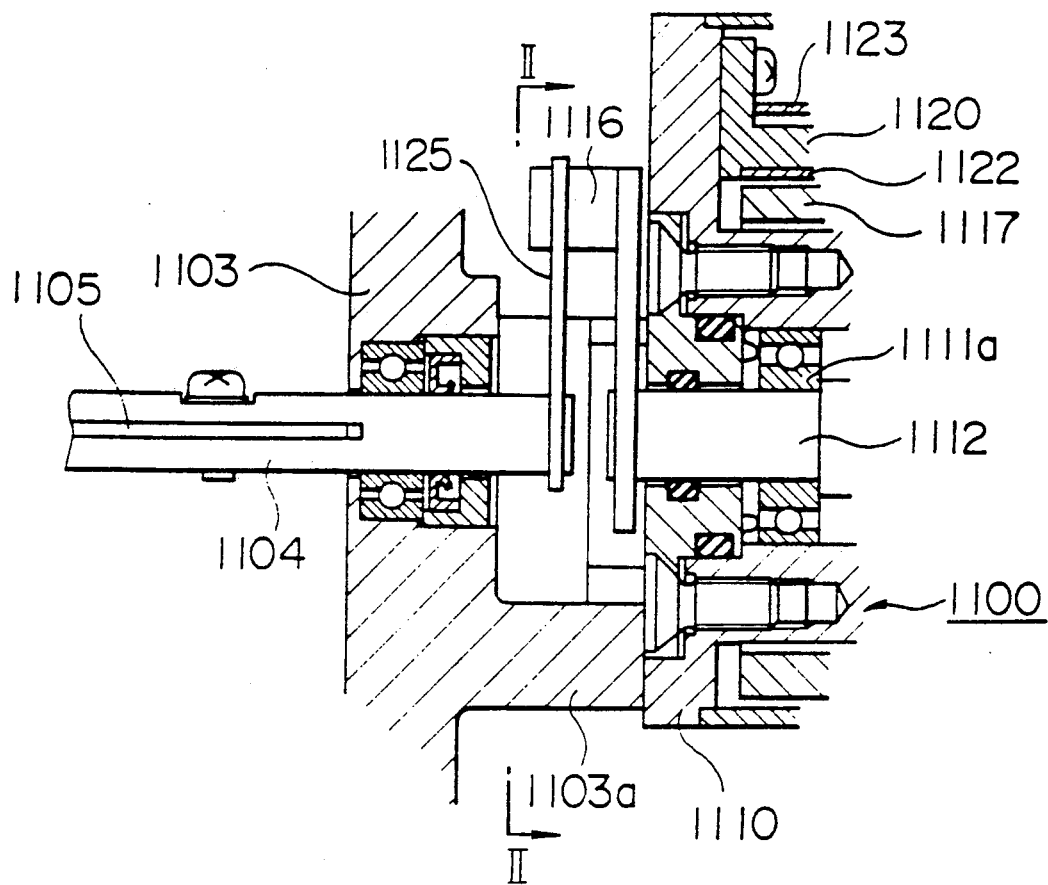
Figure 11C:
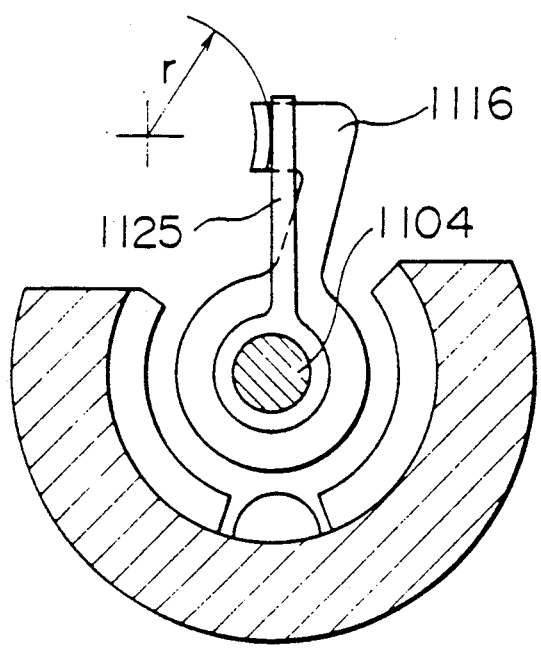
Figure 11D:
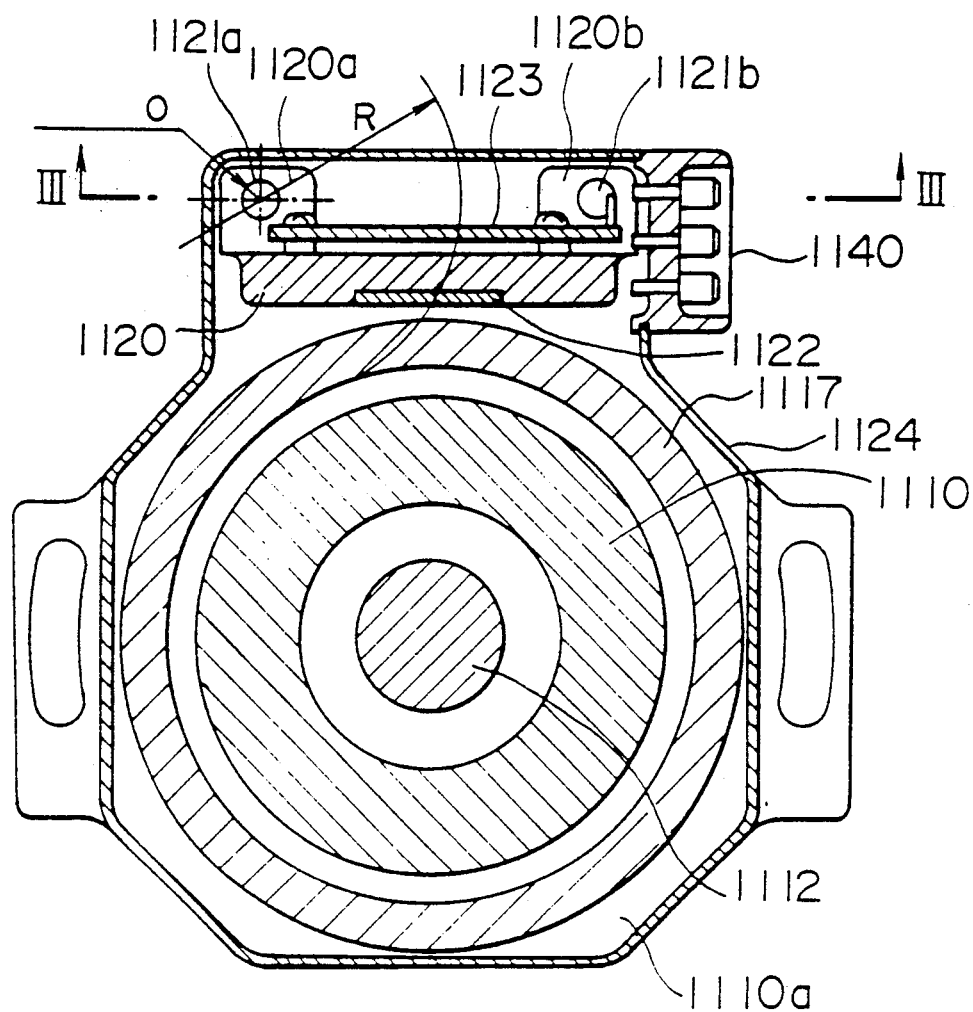
Figure 11E:
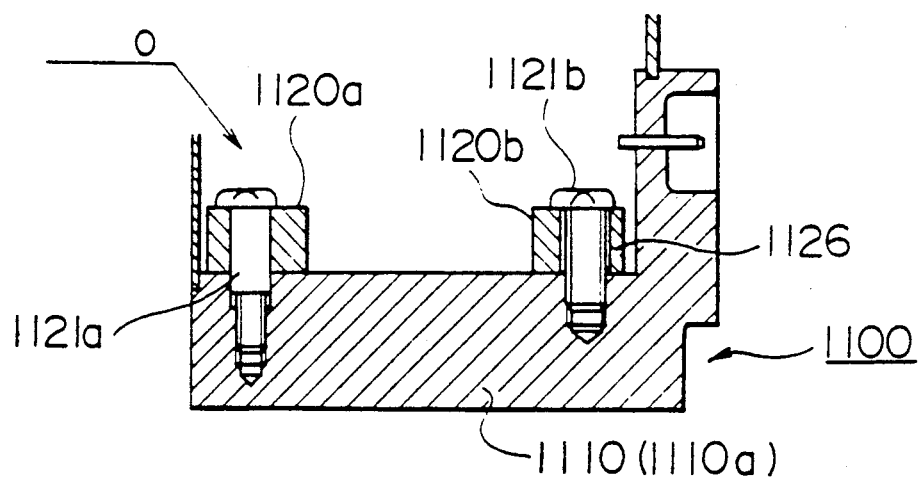
Figure 11F:
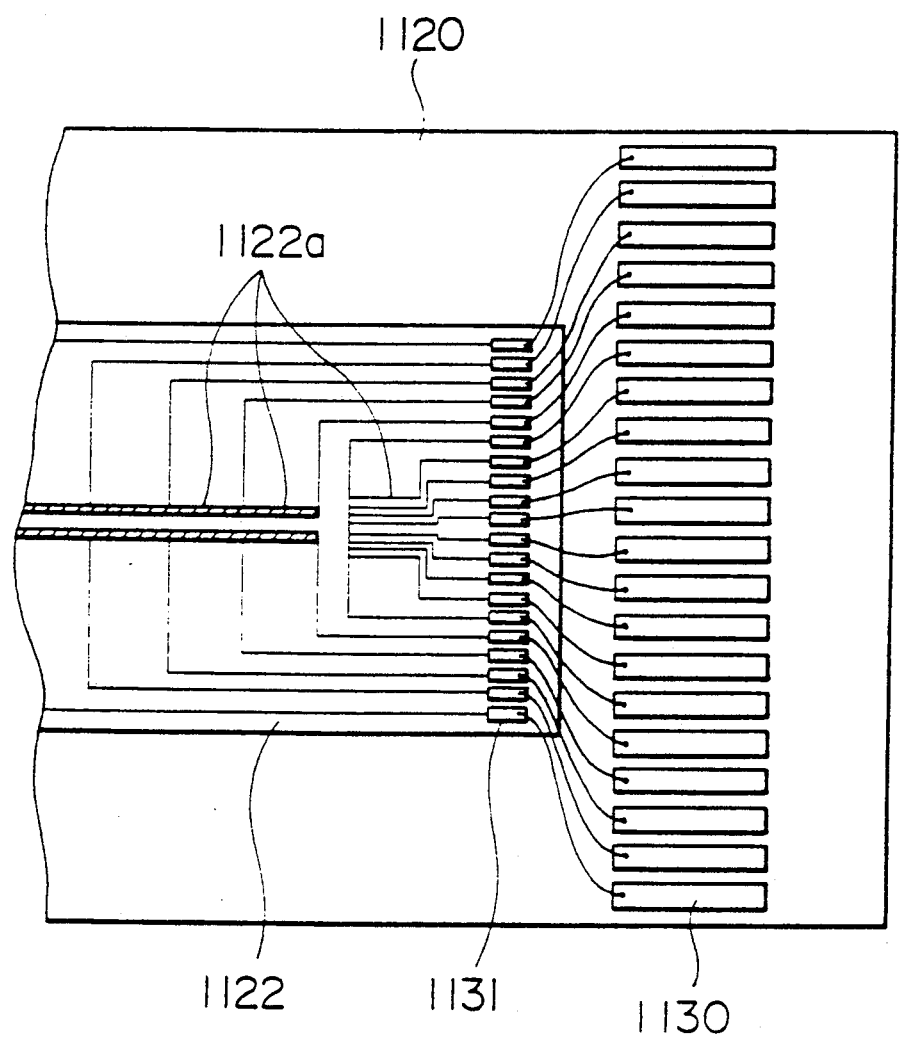
Figure 12:
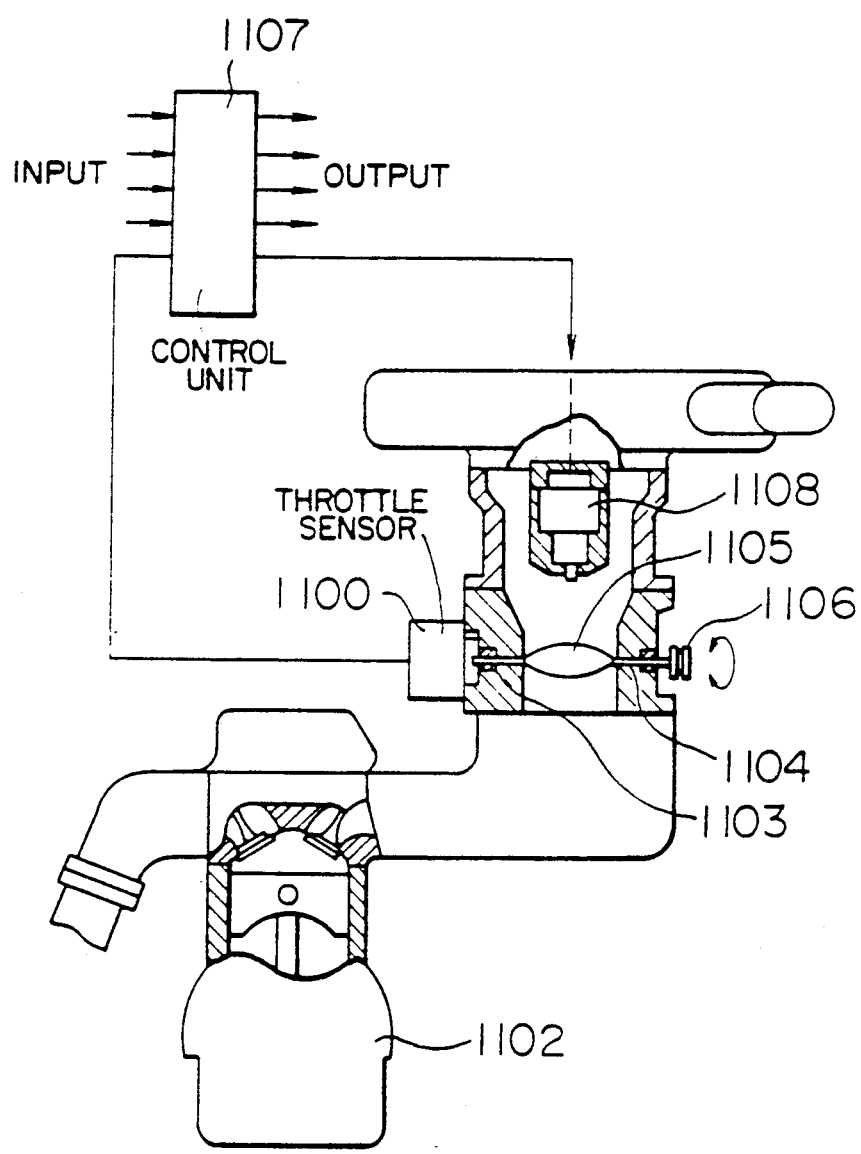
FIG. 12 illustrates mounting of the throttle sensor on an engine.

FIG. 11A shows a longitudinal sectional view of the throttle sensor of the present embodiment. FIG. 12 shows a system configuration of the engine in which the throttle sensor of the present embodiment is mounted, and FIGS. 11B to 11F show sectional views or partial views of the elements of the throttle sensor.

Prior to the explanation of detail of the throttle sensor of the present embodiment, a relationship between the throttle sensor and the engine control system is explained with reference to FIG. 12.

In FIG. 12, numeral 1100 denotes the throttle sensor which is mounted at one end of a throttle valve shaft 1104 which extends through a suction tube 1103. A throttle valve 1105 is fixed to the throttle valve shaft 1104, and the throttle valve 1105 is opened and closed by a hook 1106 to which acceleration operation by a driver is transmitted. The aperture of the throttle valve 1105 is detected by the throttle sensor 1100 and the detection signal is applied to a control unit 1107 of an engine 1102. A rotation speed signal, and water temperature signal and air/fuel ratio signal representing a condition of the engine 1102 are also applied to the control unit 1107. Based on the aperture signal of the throttle valve 1105 from the throttle sensor 1100 and the rotation speed signal, the control unit 1107 calculates the amount of suction air per revolution of the engine 1102, and calculates the amount of fuel required to attain a desired air/fuel ratio for the amount of suction air, as a valve open time of an injector 1108. A signal is applied to the injector 1108 only for the valve open time to supply the optimum amount of fuel and control an ignition signal.

The structure of the throttle sensor 1100 is explained in detail.

In FIG. 11A, numeral 1110 denotes a tubular sensor base (hereinafter referred to as base) having a flange 1110a at an end thereof. A shaft 1112 of the throttle sensor extends through the base 1110 and a space 1113 is provided in the base 1110 to house two bearings 1111a and 1111b which support the shaft 1112 at two points. The bearings 1111a and 1111b are arranged in the space 1113 at a predetermined interval. The shaft 1112 is rotatably supported by the bearings 1111a and 1111b.

The shaft 1112 has a small diameter portion 1112a and a large diameter portion 1112b. The small diameter portion 1112a is fitted to the bearing 1111a and the large diameter portion 1112b is fitted to the bearing 1111b.

One side of the bearing 1111b engages with an inner projection 1110b of the base 1110 provided at the opposite end to the flange 1110a so that the axial movement (rightward movement in the drawing) of the bearing 1111b is bound. On the other hand, one side of the bearing 1111a contacts to a step 1112c of the shaft 1112 which boarders the portions 1112a and 1112b so that the axial movement (rightward movement in the drawing) of the bearing 1111a is bound. A washer holder 1114 is fixed to an opening of the flange 1110a of the base 1110 by a screw 1115. A waved washer 1200 is inserted between the washer holder 1114 and the bearing 1111a. The bearings 1111a and 1111b are pushed rightward by an elastic force of the waved washer 1200 so that the axial leftward movement of the bearings is bound. Accordingly, the bearings 1111a and 1111b are coacted by the pushing force of the waved washer 1200, the engagement of the bearing by the inner peripheral projection 1110b of the base 1110 and the engagement of the bearing by the shaft step so that the rightward and leftward axial movements of the bearings 1111a and 1111b are bound. As a result, the axial movement of the shaft 1112 fitted to the bearings 1111a and 1111b is bound. Since the bearings 1111a and 1111b have their outer peripheries fixed in contact to the inner periphery of the base 1110, the radial movements of the bearings 1111a and 1111b and the shaft 1112 are bound. Thus, the radial movement and the axial movement of the shaft 1112 is bound and it is free only in the direction of rotation.

The left end of the shaft 1112 extends through the washer holder 1114 and the base 1110. A sensor lever 1116 which is to engage with a lever 1125 (shown in FIG. 11B) of a throttle valve shaft 1104 is mounted on the extending portion of the shaft 1112. A magnetic drum 1117 magnetized in accordance with angle information is mounted coaxially with the shaft 1112 at the right end thereof by a screw 1118. Thus, the sensor lever 1116, shaft 1112 and magnetic drum 1117 are in union. A return spring 1119 is arranged between the magnetic drum 1117 and the base 1110. The return spring 1119 is biased toward the close position of the throttle valve 1105. Numeral 1120 denotes a planar support member fixed to a portion of the flange 1110a of the base 1110 through screws 1121a and 1121b (shown in FIG. 11D). The support member 1120 is arranged to extend axially so that it faces the magnetic drum 1117. A magneto-resistive element substrate 1122 for detecting the angle information on the outer periphery of the magnetic drum 1117 is arranged on the side of the support member 1120 which faces the magnetic drum 1117. A signal processing circuit 1123 which processes the detection signal of the magneto-resistive element substrate 1122 in a predetermined method to supply an angle signal to the control unit 1107 is mounted on the side of the support member 1120. Numeral 1124 denotes a cover which is mounted to the flange 1110a of the base 1110 to enclose the parts such as magnetic drum 1117 and support member 1120.

The engagement of the shaft 1112 facing the throttle sensor 1100 and the throttle valve shaft 1104 is explained with reference to FIGS. 11B and 11C. FIG. 11B is a partial sectional view showing the engagement of the shaft 1112 and the throttle valve shaft 1104, and FIG. 11C is a sectional view taken along a line II—II of FIG. 11B. As shown in FIG. 11B, the throttle sensor 1100 has the base 1110 thereof fixed to a portion 1103a of a suction tube 1103 so that it is arranged near one end of the throttle valve shaft 1104, and the shaft 1112 is arranged coaxially with the throttle valve shaft 1104. The throttle valve shaft 1104 has one end thereof extended through the suction tube 1103, and a rod-shaped lever 1125 is mounted thereat to engage with the sensor lever 1116. The engagement surface of the sensor lever 1116 which engages with the lever 1125 is of arcuate shape having a radius $\gamma$ as shown in FIG. 11C, and the levers 1125 and 1116 are engaged by a linear contact. In this manner, the shaft 1112 facing the throttle sensor 1100 and the throttle valve shaft 1104 engage, and the rotation force of the throttle valve shaft 1104 is transmitted to the shaft 1112 through the lever 1125 and the sensor lever 1116. In the present embodiment, the throttle valve open direction is counterclockwise as shown in FIG. 11C. Under this condition, the sensor lever 1116 and the lever 1125 always engage. On the other hand, when the throttle valve 1105 moves clockwise, the sensor lever 1116 follows the movement of the lever 1125 by the elastic force of the return spring 1119 so that it returns in the direction to close the throttle valve 1104 while it contacts to the lever 1125. Accordingly, exact detection is attained.

A spacing between the magnetic drum 1117 and the magneto-resistive element substrate 1122 is adjustable. This is explained with reference to FIGS. 11D and 11E. FIG. D shows a sectional view taken along a line I—I of FIG. 11A, and FIG. 11E shows a sectional view taken along a line III—III of FIG. 11D. As shown in FIGS. 11A, 11D and 11E, the support member 1120 has its mount portions 1120a and 1120b abutted against the flange 1110a of the base 1110 and fixed to the flange 1110a by the screws 1121a and 1121b, as shown in FIG. 11E, an inner diameter of a threaded hole 1126 of the mount 1120b is sufficiently larger than a diameter of the screw 1121b so that there is a slight gap between the threaded hole 1126 and the screw 1121b. Thus, when the screws 1121a and 1121b are loosened, the support member 1120 which supports the magneto-resistive element substrate 1122 is rotatable around a point 0 of the screw 1121a within the range of the gap of the threaded hole 1126. As shown in FIG. 11D, the axial center line of the magneto-resistive element substrate 1122 is at a position of a radius R centered at the point 0. Thus, the spacing between the magnetic drum 1117 and the magneto-resistive element substrate 1122 can be readily adjusted by rotating the support member 1120.

Since the positions of the support member 1120 and the base 1110 are determined solely by the fixing bolts 1121a and 1121b, the positioning of the magneto-resistive element substrate 1122 is done by adjusting only the spacing between the magnetic drum 1117 and the magneto-resistive element substrate 1122.

A structure of the support member 1120 which contains the magneto-resistive element substrate 1122 and the signal processing circuit 1123 is now explained.

The support member 1120 is formed by a planar resin mold, and conductors 1130 which extend through the support member 1120 are mounted on the support member 1120. The conductors 1130 may be embedded when the resin mold of the support member 1120 is formed. FIG. 11F shows a wiring structure of the magneto-resistive elements 1121a and the conductors 1130 formed on the surface of the support member 1120. Terminals 1131 of the magneto-resistive elements 1122a on the magneto-resistive element substrate 1122 on the support member 1120 and the conductors 1130 are connected by wire-bonding. Usually, four magneto-resistive elements 1122a are used to constitute a bridge to detect a signal and a number of bridges (and hence a number of signals) should be constructed (or produced) in order to attain high precision detection function. As a result, the number of terminals increases. Accordingly, the automated connection by the wire-bonding is used to enhance the efficiency of the connection work.

The other sides of the conductors 1130 are connected to the signal processing circuit 1123 on the back side of the support member 1120 as shown in FIG. 116. The signal processing circuit 1123 comprises a bridge circuit 1133 which bridges the magneto-resistive elements 1122a, a shaping circuit 1134 for shaping the signal supplied from the bridge circuit 1133, and an output circuit 1135 which produces angle information based on the shaped signal. The conductors 1130 and the circuits are connected by conductor patterns 1136a–1136d.

Figure 11G:
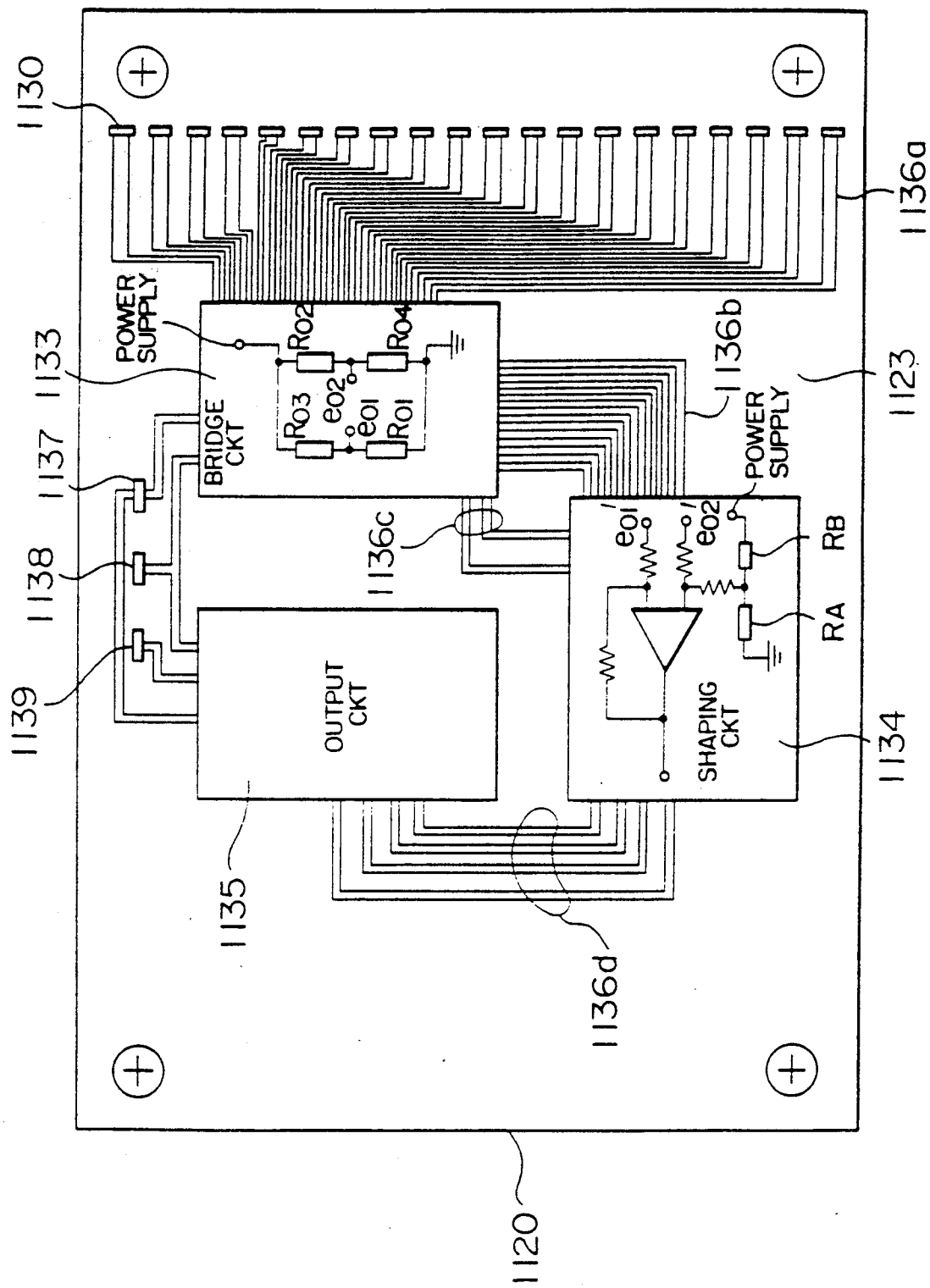

In the bridge circuit 1133, mid-point potentials $e_{01}$ and $e_{02}$ from the four elements R01, R02, R03 and R04 of the bridge are applied to $e_{01}'$ and $e_{02}'$ of the shaping circuit 1134 and shaped thereby. Since there is variance among the elements R01–R04, it is necessary to adjust $R_A$ and $R_B$ in order to cancel a difference between the mid-point potentials $e_{01}'$ and $e_{02}'$ due to the variance. In the present embodiment, as shown in FIG. 11A, the elements of the signal processing circuit 1123 are exposed to atmosphere when the cover 1124 is removed, and the resistors $R_A$ and $R_B$ can be adjusted by laser trimming. The bridge circuit 1123 and the shaping circuit 1134 shown in FIG. 11G are for one signal, and as many such circuits as the number of signals are actually provided.

The signal processing circuit 1123 can supply the aperture signal to the external only through power supply terminal 1137, ground terminal 1138 and one or more output terminal 1139, and other signal lines need not be used. Accordingly, the reliability is improved. The input/output terminals 1137–1139 are taken out by an output connector 1140 as shown in FIG. 11D.

In the present embodiment, as the throttle valve shaft 1104 is rotated in the direction to open the throttle valve as the acceleration pedal is depressed, the sensor shaft 1112 is rotated by the rotation force of the throttle valve shaft 1104 through the levers 1116 and 1125 provided at the ends of the throttle valve shaft 1104 and the sensor shaft 1112, respectively. On the other hand, when the throttle valve shaft 1104 rotates in the direction to close the throttle valve, the sensor lever 1116 and the sensor shaft 1112 follow the lever 1125 and rotate by the elastic force of the return spring 1119. The magneto-resistive elements 1122a detect the magnetic pattern of the magnetic drum 1117 which changes with the rotation, and the signal processing circuit 1123 produces a signal representing the rotation angle of the throttle valve shaft 1104 or the aperture of the throttle valve 1105.

The sensor of the present embodiment has the throttle valve shaft 1104 and the sensor shaft 1112 separately, which are engaged by the levers 1116 and 1125. Accordingly, the axial and radial mechanical vibrations of the throttle valve shaft 1104 are absorbed by the engaging surfaces of the levers so that the mechanical vibrations are prevented from being transmitted to the sensor shaft 1112. In the present embodiment, the radial movement of the sensor shaft 1112 is bound by the two bearings 1111a and 1111b and the axial movement thereof is bound by the biasing force of the spring member 1200, the magnetic drum 1117 mounted at one end of the shaft 1112 is free to move only in the direction of rotation and other movements are bound. Accordingly, the positions of the magnetic drum 1117 and the magneto-resistive element substrate 1122 and the spacing therebetween can be held constant by the non-transmission of the mechanical vibration from the throttle valve shaft 1104 and radial and axial binding actions of the sensor shaft 1112, and the reduction of detection precision is prevented.

Since the throttle sensor 1100 comprises a sensor assembly including the sensor shaft 1112 formed separately from the throttle valve shaft 1104, the bearings 1111a and 1111b for supporting the sensor shaft, the magnetic drum 1117 and the magneto-resistive element substrate 1122, it is possible to preset the relative positions of the magnetic drum 1117 and the magneto-resistive element substrate 1122 in the manufacturing process of the sensor. Accordingly, it is not necessary to adjust the relative positions of the magnetic drum and the magneto-resistive element when the sensor is mounted, and the sensor mount work is simplified. By the engagement system of the levers 1116 and 1125, the rotation force can be transmitted even if there is off-centering in the engagement of the throttle valve 1104 and the shaft 1112.

The magneto-resistive element substrate 1122 to be arranged to face the outer periphery of the magnetic drum 1117 and the signal processing circuit 1123 are mounted on the front and back sides of the support member 1120, and the terminals of the magneto-resistive element substrate 1122 and the terminals of the signal processing circuit 1123 are connected by the conductors 1130 which extend through the support member 1120. Accordingly, unnecessary extentions of signal lines from the magneto-resistive element substrate 1122 is avoided, the reliability in signal processing is enhanced and a space of the signal processing circuit 1123 is saved. By adjusting the spacing between the support member 1120 and the magnetic drum 1117 by rotating the support member 1120 around a point, the axial and circumferential adjustments are not required. As a result, the adjustment of the signal processing circuit and the adjustment of the spacing between the magnetic drum and the magneto-resistive elements are facilitated.

Figure 2:
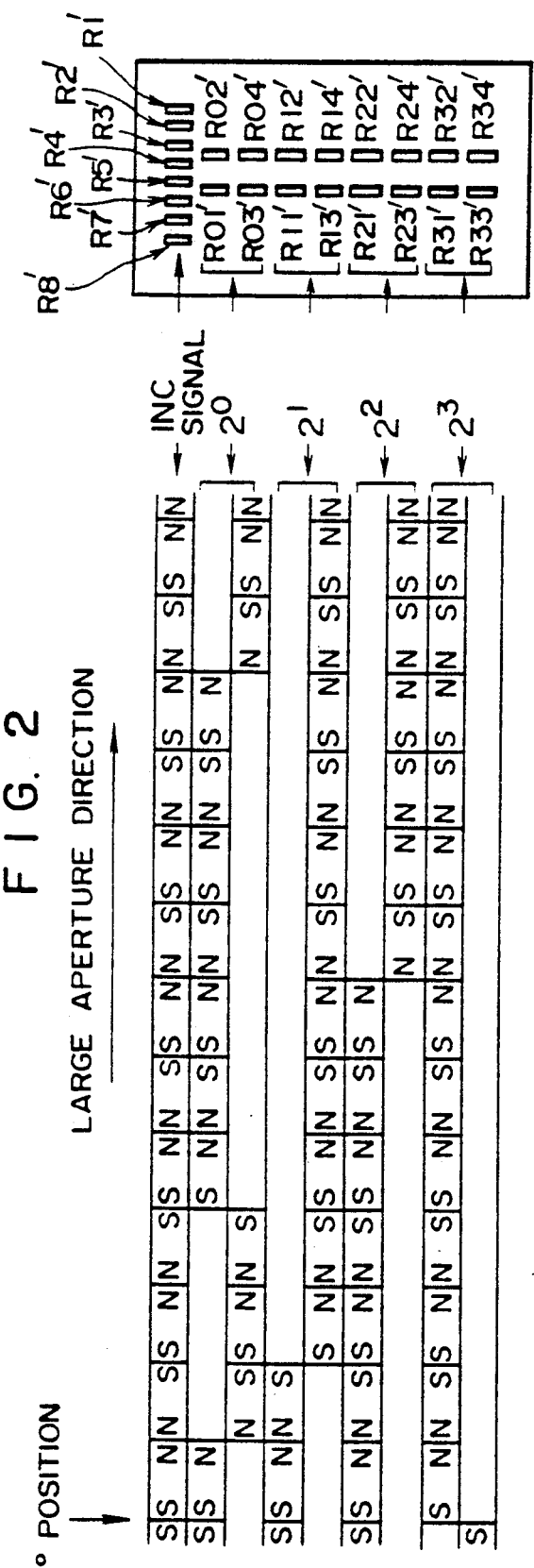
FIG. 2 shows a developed view of magnetic material and magneto-resistive element in one embodiment of the present invention.

FIG. 2 shows a developed view of the magnetic materials on the outer periphery of the drum 1117 and the magneto-resistive elements on the substrate 1122 shown in FIG. 11a.

A track for a high resolution signal and an increment signal to discriminate the rotation direction, and 4-bit magnetic materials which form one bit by two tracks are formed on the outer periphery of the drum 1117. The magneto-resistive elements R1'–R8', R01'–R04', R11'–R14', R21'–R24' and R31'–R34' for the respective tracks are arranged on the substrate 1122 at the interval described above.

Figure 13:
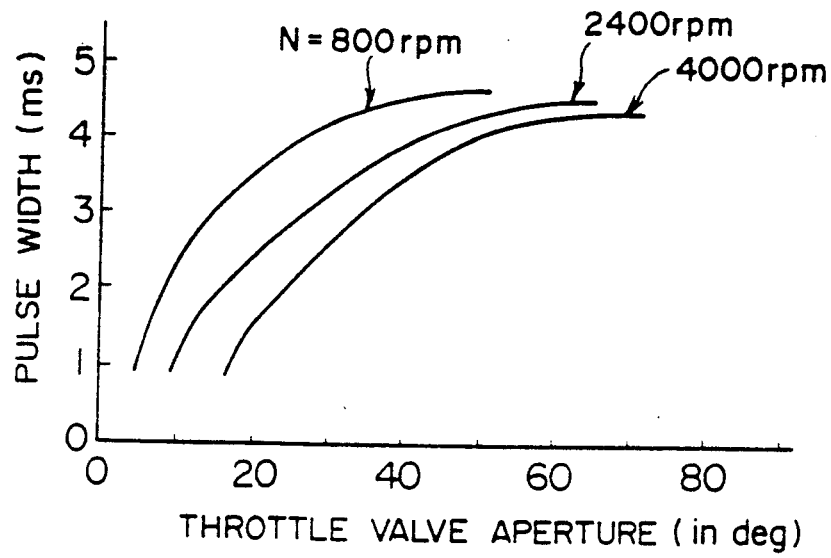
FIGS. 13 and 14 show characteristic curves of the engine.

The absolute signal in the present embodiment is now explained. FIG. 13 shows the aperture of the throttle valve 1105 of the internal combustion engine versus a pulse width for calculating the amount of jet. It corresponds to a time required to open a fuel supply electromagnetic valve 1108 to attain a predetermined air/fuel ratio for the amount of suction air in one cycle. It also corresponds to the amount of fuel supplied for one cycle. If the throttle valve aperture of FIG. 13 is detected by the absolute signal which has four bits in a 90-degrees section, the aperture per data is 5.625 degrees. Thus, in a small aperture area in which the change of pulse width is abrupt, the engine condition is abruptly changed by the change of one data. In the detection of the aperture of the throttle valve 1105 having such a characteristic, high precision is required in the small aperture area. Accordingly, in the small aperture area, it is necessary to know precise and absolute aperture.

Since the 4-bit configuration is used in the present embodiment, 16-step signals represented by 4-bit absolute signals are arranged at a small pitch in the small aperture area and arranged at a large pitch in a large aperture area in which the change of pulse width to the aperture of the throttle valve 1105 is gentle so that 16-step signals are generated at an uniform interval in the 90-degrees section. By arranging the absolute signals in this manner, the change of pulse width to the transition point of the absolute signal is substantially linear so that the precision represented by one state of the absolute signal is substantially uniform over the entire measurement section.

Figure 14:
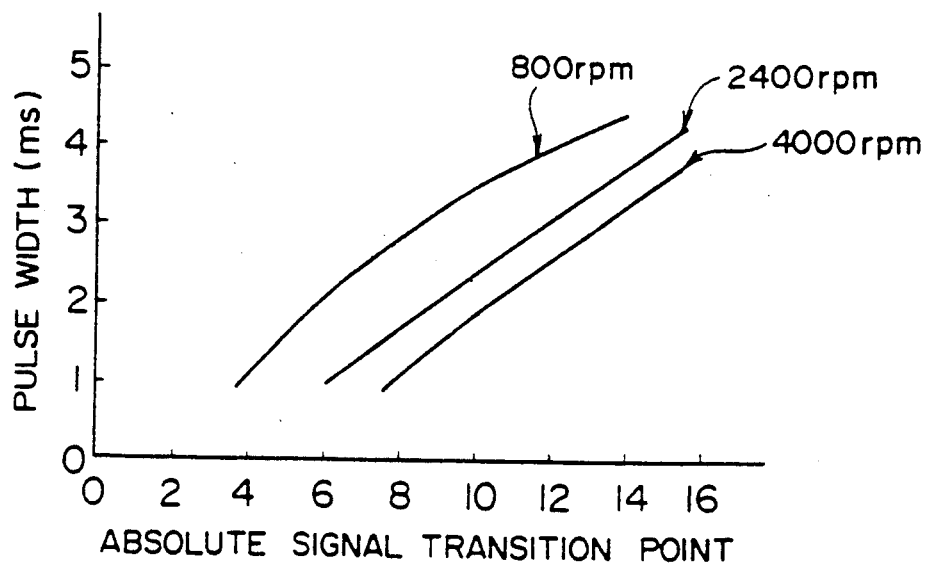

A relationship between the transition points of the absolute signal shown in FIG. 14 and the aperture of the throttle valve 1105 and the number of increment signals is shown in FIG. 1B. In the present embodiment, the numbers allotted to the transition points of the absolute signals are represented by the accumulated numbers of high resolution signals which represent angles between the origin point and the transition points. Below the aperture 30 degrees where the change of pulse width is abrupt, 14 steps of absolute changes are caused, and in the section between 30 degrees and 90 degrees in which the change of pulse width is gentle, two steps are used. While the signals are represented by a gray code, other code such as a binary code may be used.

A relationship between the transition points of the absolute signal and the increment signal is explained with reference to FIG. 1B. In the present embodiment, in the section up to the transition point "14" of the absolute signal corresponding to the aperture 30 degrees of the throttle valve 1105, the accumulated number of increment signals contained in the section up to the transition point of the N-th absolute signal is set to $N \cdot (N+1)/2$. Thus, the transition point "15" corresponds to the number of increment signals of 200, and the last transition point "16" corresponds to 315. The increment signals are generated at a constant angular pitch in the measurement section. The increment signals comprise phase A and phase B having a 90-degree phase difference therebetween.

As shown in FIG. 1A, the accumulated number of increment signals is 21 at the transition point "6" of the absolute signal. Thus, an absolute angle position is known when the absolute signal "6" is detected. The corresponding number of increment signals is set into a counter at the transition point of the absolute signal, and the counter is incremented (angle increment) or decremented (angle decrement) by the increment signals until the next transition point is reached so that the current position is known before the absolute signal next transits. Thus, the absolute position detection can be interpolated with the same resolution as that of the increment signals. The increment signals may be frequency-divided by a factor of k (integer). In this case, since the absolute signals may transit here and there, the number of bits of the absolute signals may be reduced.

Figure 4A:
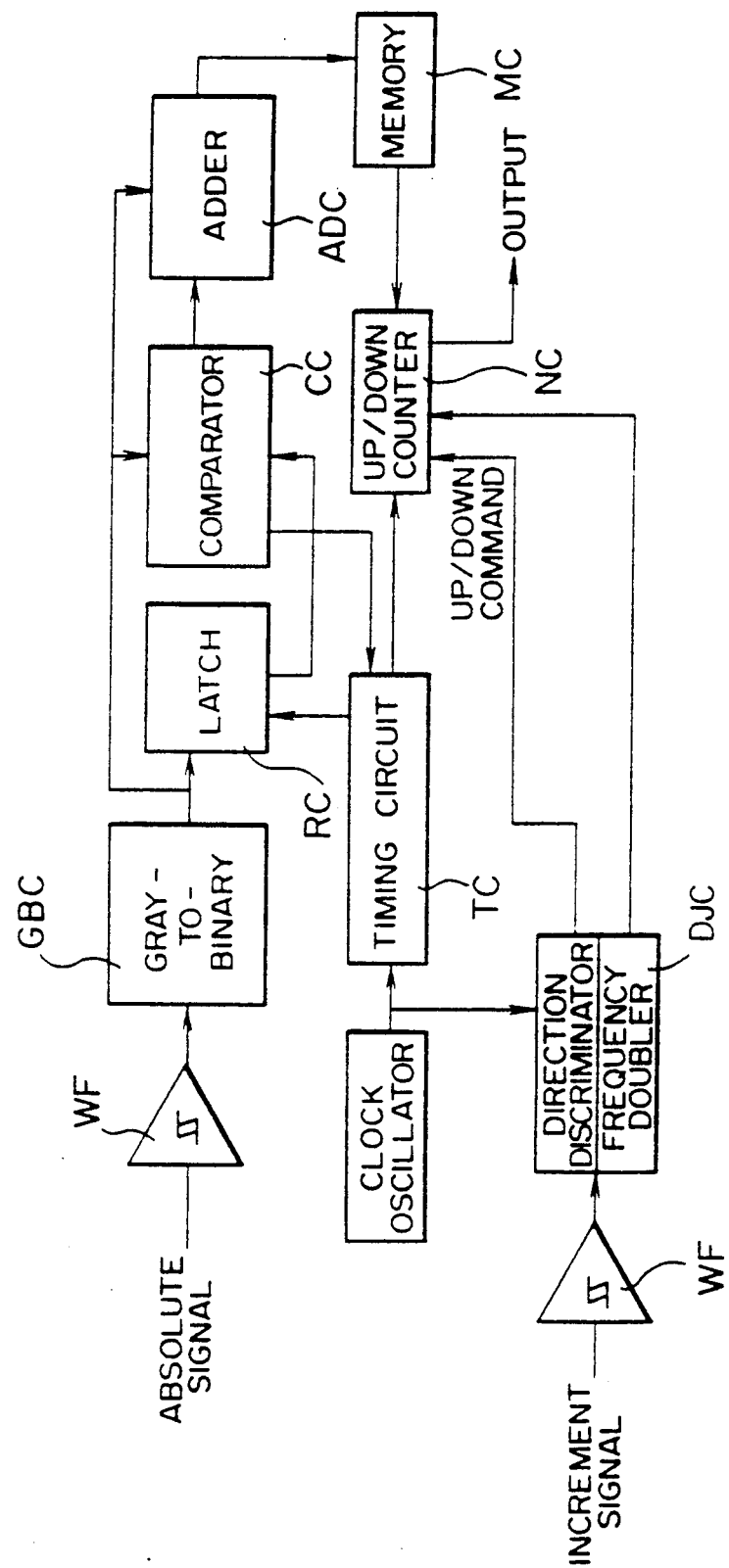

Referring to FIG. 4A, the calibration of the absolute position by the detection of the absolute signals and the configuration of the signal processing circuit are explained.

The absolute signal detected by the magnetoresistive elements on the substrate 1122 is shaped by wave shaping means WF and converted from a gray code to a binary code by a converter GBC for signal processing. The signal is compared with the stored absolute signal by a latch circuit RC and a comparator CC. If there is a difference between those signals, a content of a memory MC is reloaded to a counter NC by a signal from a timing circuit TC. If the absolute signal changes in a decrease direction, the absolute signal after the transition (current value) is incremented by one, and the incremented value is used as the address for the memory MC. In this case, an adder ADC adds "1" to the absolute signal to produce the addressing signal. The data in the memory MC contains the number of resolution signals representing the transition points of the absolute signals. After the calculation value has been set in the counter, the current absolute signal is latched in the latch RC as the compare data.

Until the next transition of the absolute signal, the counter NC is driven by the high resolution signal derived from the increment signal so that the content of the counter NC always represents the current absolute position.

The processing of the signal detected by the magneto-resistive elements on the substrate 1122 is explained.

Figure 3:
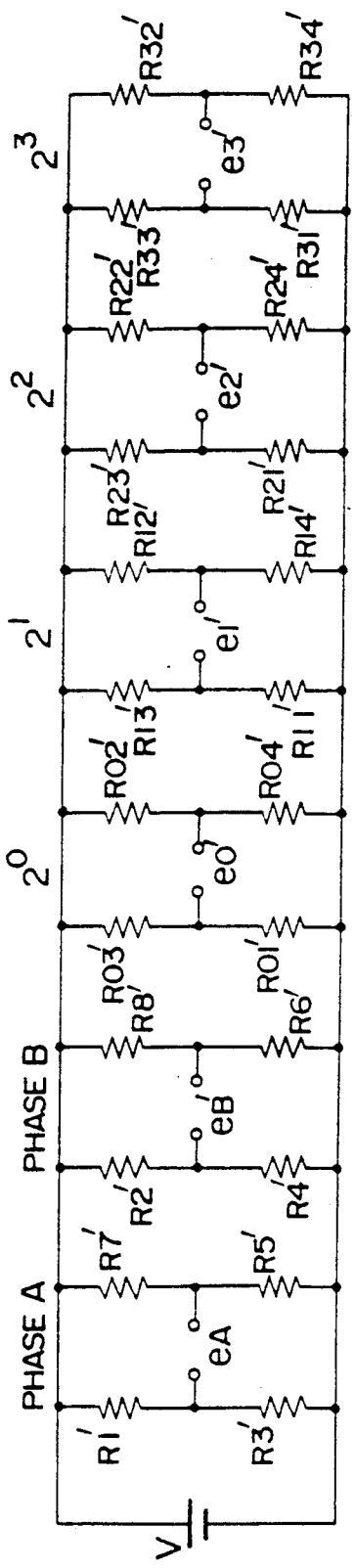
FIG. 3 shows a bridge circuit of the magneto-resistive element of FIG. 2, FIGS. 4A, 4B, 5 and 9 show signals processing circuits.

The magneto-resistive elements on the substrate are bridged as shown in FIG. 3, and a voltage $e_A'$ is taken out for the phase A, a voltage $e_B'$ is taken out for te phase B, a voltage $e_O'$ is taken out for the bit $2^0$, a voltage $e_1'$ is taken out for the bit $2^1$, a voltage $e_2'$ is taken out for the bit $2^2$ and a voltage $e_3'$ is taken out for the bit $2^3$.

As shown in FIG. 4(b), a voltage is applied to the magneto-resistive elements from a power supply terminal 100. The outputs $e_A'$, $e_B'$ and $E_0'$-$E_3'$ are applied to the comparators 101a-101f, respectively. If the resistances of the four elements in the bridge are equal, no problem is raised. In actuality, however, there is a variance. Accordingly, offset circuits 102a-102f for cancelling the potential difference due to the variation are connected to the inputs. The operation of the offset circuit 102a is explained. The offset circuit 102a adjusts the potential at a point a. In the present embodiment, a hybrid IC is used to constitute a waveform shaping circuit. Two resistors Ra and Rb are provided to divide the potential supplied from the power supply terminal 100 and they are adjusted by laser trimming to adjust the potential at the point a.

Numeral 109 denotes a gray code-to-binary code converter which comprises exclusive OR gates (EX-OR) 110a-110d (for example, standard logic IC such as Hitachi HD74LS86), numeral 111 denotes a latch (for example, a standard logic IC such as RCA CD4042B) which stores the current absolute signals 105'-108' by the latch signal 200, numeral 112 denotes a comparator (for example, a standard logic IC such as RCA CD4584B) which compares the current absolute signals 105'-108' with the absolute signals 105"-108" in the latch 111, numeral 113 denotes an adder (for example, a standard logic IC such as Hitachi GH14008B) which, when the comparator indicates that (105'-108')<(105"-108"), adds the output signal 201 to the current absolute signals 105'-108' to return them to the values prior to the reduction, and numeral 114 denotes a memory (for example, a standard IC memory such as Hitachi HN48276G) which produces a calculated absolute position corresponding to the absolute signal supplied from the adder 113. Numerals 115a, 115b and 115c denote preset counter (for example, a standard logic IC such as RCA CD4029B) which read in data from the memory 114, numeral 117 denotes a timing circuit which receives a signal 202 and produces a preset signal 203 and a latch signal 200 to set data in the preset counters 115a, 115b and 115c. It comprises inverters 118a and 118b (standard logic IC such as Hitachi HD74LS04), D-flip-flops 121a and 121b (standard logic IC such as Hitachi HD74LS74A) and AND gates 119 and 120 (standard IC such as Hitachi HD74LS11, HD 74LS08). Numeral 170 denotes an initialization circuit which comprises resistors Γ1 and Γ2, capacitors $C_1$ and $C_2$ and an EX-OR gate 110S.

Numeral 122 denotes a clock oscillator, numeral 123 denotes a rotation direction discriminator/ increment signal frequency doubler (DJC in FIG. 4A), and numeral 599 denotes an output processing circuit which converts the status of the outputs 501a-502a of the preset counters 115a, 115b and 115c to duty signals.

Figure 5:
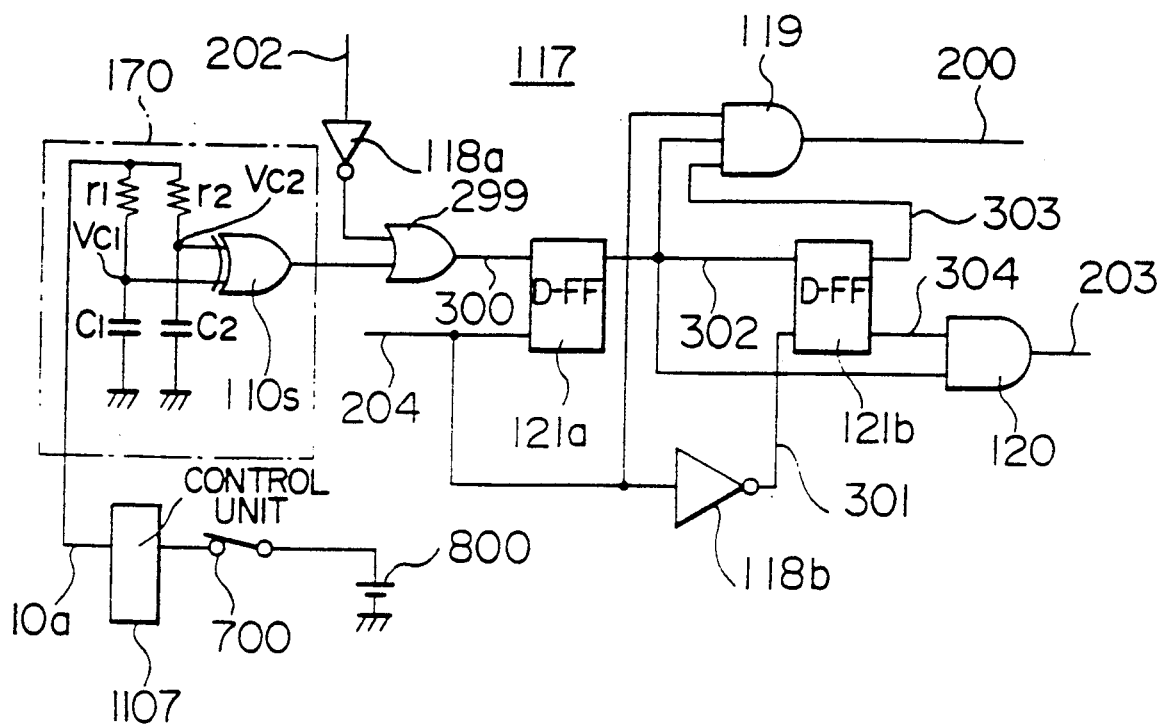

The initialization in the operation of the signal processing circuit is explained. A power to the signal processing circuit of FIG. 4B is supplied from a control unit 1107 which controls an engine 1102. As shown in FIG. 12, when an ignition key 700 is turned on, the power from the battery 800 is supplied to the control unit 1107. Then, as shown in FIG. 5, a power is supplied from the control unit 1107 to the throttle sensor 1100 through a power supply line 10a. The resistances θ1 and θ2 of the initialization circuit 170 are equal and the capacitances of the capacitors are $C_1 < C_2$. Thus, in the initialization circuit 170, there is a difference of ΔT between times required for the potentials $V_{C1}$ and $V_{C2}$ to reach the potential Vin, as shown in FIG. 7, respectively. Accordingly, the output of the EX-OR gate 1105 which receives $V_{C1}$ and $V_{C2}$ is produced time T from the supply of power and lasts for time ΔT, as shown in FIG. 7. The delay time T is set to a time from the supply of power to the signal processing circuit of FIG. 4B to the time at which the processing circuit is ready to operate.

Figure 6:
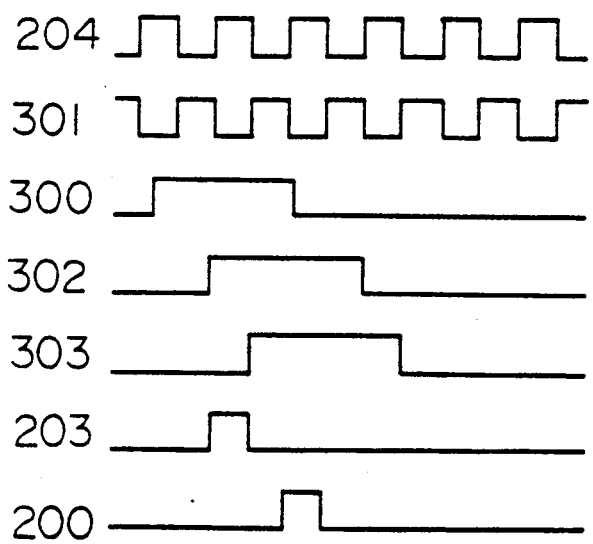
FIG. 6 shows a time chart of the signal processing circuit of FIG. 5.

The signal of FIG. 7 is supplied to an OR gate 299 (standard logic IC such as RCA CD4071B) of the timing circuit 117. The output 300 of the OR gate 299 unconditionally assumes H-state for the time ΔT. The operation of the timing circuit 117 is explained with reference to a timing chart of FIG. 6. The output 300 of the OR gate 299 is applied to a data input terminal of a D-flip-flop 121a.

When the clock signal 204 from the clock oscillator 122 changes from L to H at the clock terminal of the D-flip-flop 121a, the signal 302 assumes H and it is applied to the data input terminals of the AND gates 119 and 120 and the D-flip-flop 121b. The signal 304 from the inverting output terminal of the D-flip-flop 121b is now H, and the output 203 of the AND gate 120 changes from L to H. The signal 203 causes the read-in of the data of the preset counters 115a, 115b and 115c to produce a set signal so that the calculation value from the memory 114 is set into the preset counters 115a, 115b and 115c.

Assuming that the throttle valve 1105 is between the transition points "5" and "6" of the absolute signal shown in FIG. 1A, this state is detected by the magneto-resistive elements on the substrate 1122, and it is shaped by the comparators 101a-101d and detected as the absolute signal by the "0111"gray code shown by 105-108. This signal is converted to "0101" by the gray code-to-binary code converter 109, as shown by 105'-108'. The "0101"absolute signal is applied to the adder 113 which adds "0101"to the signal 201, and the sum is supplied to the memory 114. Since the current absolute signals 105'-108' are smaller than the signals 105"-108" in the latch 111, the signal 201 is L at the initial state.

The adder 113 calculates "0101" +"0" and outputs "0101" to the memory 114. The memory 114 receives "0101" as an adders and outputs a calculation value for the transition points "5" of the absolute signal at the address "0101".

Accordingly, the calculation value (for example, "60" in decimal notation) for the transition point 5 of the absolute signal is initially set into the preset counters 115a, 115b and 115c by the preset signal 203 from the timing circuit 117. The number of calibrations will be explained in detail hereinlater. In the timing circuit 117, when the signal 301 inverted by the inverter 118b changes from L to H, the output of the D-flip-flop 121b assumes H, which is supplied to the AND gate 119.

In the AND gate 119, the signals 302 and 303 are H, and the latch signal 200 assumes H at the rise of the clock signal 204. As the latch signal 200 assumes H, the data 105'-108' are latched in the latch 111 and the initialization for the absolute position calibration is completed.

The operation of the signal processing circuit after the initialization is now explained. It is assumed that the throttle valve 1105 is between the transition points "5" and "6" of the absolute signal at the initialization state, and then it moves toward the open position and exceeds the transition point "6"of the absolute signal.

This state is detected by the magneto-resistive elements on the substrate 1122 so that the signals 105-108 are "0101".

It is converted by the gray code-to-binary code converter to "0110" (binary code), as shown by 105'-108'. The comparator 112 compares the signals 105'-108' with the signals 105"-108" latched in the latch 111. Since 105'-108' (0110) >105"-108" (0101), the signal 201 remains at L and the adder 113 calculates "0110"+"0" and outputs the sum "0110" to the memory 114. The memory 114 receives "0110" as an address and outputs the calculation value (for example, "84"in decimal notation) corresponding to the transition point "6" of the absolute signal at the address "0110". The value calculated will be explained in detail hereinlater.

On the other hand, since it is now 105'-108'≠105"-108", the output 202 of the comparator 112 assumes L. This signal is inverted by the inverter 118a of the timing circuit 117 and it is applied to the OR gate 299. The output 300 of the OR gate 299 is applied to the data input terminal of the D-flip-flop 121a. The subsequent operation of the timing circuit 117 is same as that in the initialization. The preset signal 203 is outputted to the preset counters 115a, 115b and 115c to preset the calculation value supplied from the memory 114. After the presetting, the latch signal 200 is outputted to the latch 111 to latch the new data 105'-108'. On the other hand, the comparator 112 detects 105'-108'=105"-108" so that the output signal 202 thereof assumes H. As a result, the output 300 of the or gate 229 of the timing circuit 117 assumes L and the D-flip-flops 121a and 121b change the outputs 302 and 303 to L by the clock signals 204 and 301, respectively.

In this manner, the calculation value is set and the new data is latched, and the circuits are ready to detect the next change in the absolute signal.

The calibration of the absolute position is described concerning the case when the throttle valve rotates toward the close position and the transition point of the absolute signal decreases. As the throttle valve changes from the point between the transition points "6" and "7" of the absolute signal to the point between the transition points "5" and "6", the data 105'-108' assume "0101", which is compared by the comparator 112 with "0110" latched in the latch 111. Since 105'-108'<105"-108", the signal 201 assumes H to produce an add signal 1. The adder 113 calculates "0101"(current data)+"0001" to produce "0110", which is supplied to the memory 114. The memory 114 outputs the data ("84" in the decimal notation) at the transition point '6' of the absolute signal. This data is set into the preset counters 115a, 115b and 115c by the function of the timing circuit 117 to calibrate the absolute position. Since the throttle valve moves toward the close position and the direction discriminator 123 provides the down signal to the preset counters 115a, 115b and 115c, it is necessary to calibrate it by the maximum count between the sections 5 and 6 of the absolute signal, that is, the count corresponding to the transition point 6 of the absolute signal. Accordingly, the calibration of the absolute position at the transition point of the absolute signal is effected at the transition point both in the open direction and in the close direction of the throttle valve 1105. In this manner, exact absolute position calibration is effected.

Figure 8A:
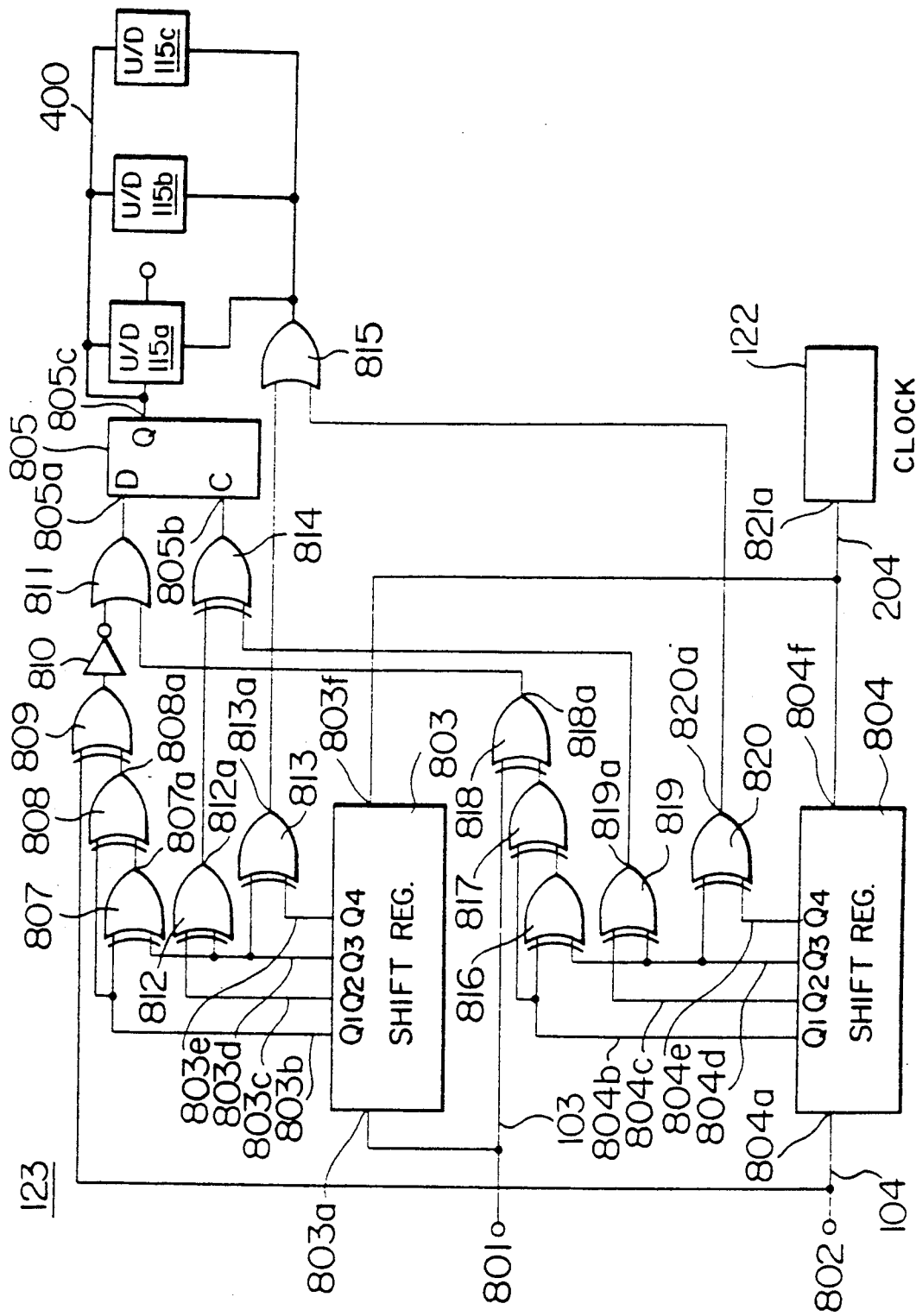
FIG. 8A shows a detail of direction discriminator and frequency doubler.

Referring to FIGS. 8A and 8B, the phase A and phase B signals 103 and 104 are explained.

A phase A signal 103 input terminal 801 is connected to an input terminal 803a of a shift register 803 and one input terminal of an EX-OR gate 818, and a phase B signal 104 input terminal 802 is connected to an input terminal 804a of a shift register 804 and one input terminal of an EX-OR gate 809. A $Q_1$ output 803b of the shift register 803 is connected to one input terminal of an EX-OR gate 807 and one input terminal of an EX-OR gate 808, a $Q_2$ output 803c is connected to one input terminal of an EX-OR gate 812, a $Q_3$ output 803d is connected to the other input terminal of the EX-OR gate 807, the other input terminal of the EX-OR gate 812 and one input terminal of an EX-OR gate 813, and a $Q_4$ output 803e is connected to the other input terminal of the EX-OR gate 813. An output 807a of the EX-OR gate 807 is connected to the other input terminal of the EX-OR gate 808, an output of the EX-OR gate 809 is connected to one input terminal of an OR gate 811 through an inverter 810, an output 812a of the EX-OR gate 812 is connected to one input terminal of an EX-OR gate 814, and an output 813a of the EX-OR gate 813 is connected to one input terminal of an OR gate 815. Similarly, $Q_1$, $Q_2$, $Q_3$ and $Q_4$ outputs 804b, 804c, 804d and 804e of the shift register 804 are connected to input terminals of EX-OR gates 816, 817, 819 and 820, outputs of the EX-OR gates 816 and 817 are connected as shown, an output 818a of the EX-OR gate 818 is connected to the other input terminal of the OR gate 811, an output 819a of the EX-OR gate 819 is connected to the other input terminal of the EX-OR gate 814, and an output 820a of the EX-OR gate 820 is connected the other input terminal of the OR gate 815. An output of the OR gate 811 is connected to a data input terminal 805a of a D-flip-flop 805, an output of the EX-OR gate 814 is connected to a clock input terminal 805b of the D-flip-flop 805, a Q output 805c of the D-flip-flop 805 is connected to an up/down selection input terminal of an up/down counter 115a, 115b, 115c and an output of the OR gate 815 is connected to a clock input terminal of the up/down counters 115a, 115b, 115c. An output 204 of a clock oscillator 122 is connected to clock input terminals 803f and 804f of the shift registers 803 and 804.

FIG. 8B shows a time chart where a direction of rotation of a rotor (not shown) is detected whenever the phase A signal pulse of FIG. 8A rises or falls and forward counting is effected. In FIG. 8B, numeral 204 denotes the clock signal, numeral 103 denotes the phase A signal, numeral 104 denotes the phase B signal, numeral 812a denotes a direction detection pulse, numeral 813a denotes a count pulse, and numeral 400 denotes a direction signal. The output 204 of the clock oscillator 122 is designated by numerals 211-230 corresponding to the rises of pulse of the clock signal 204. When the phase A signal 103 of FIG. 8B is supplied from the phase A input terminal 801 to the input terminal 803a of the shift register 803, the shift register 803 produces the $Q_1$ output 803b at the rise 213 of the clock signal 204. Thereafter, whenever the pulse of the clock signal 204 is supplied, the shift register 803 sequentially produces the $Q_2$ output 803c, the $Q_3$ output 803d and the $Q_4$ output 803e. The output 807a is an exclusive OR function of the $Q_1$ output 803b and the $Q_3$ output 803d of the shift register 803 and it is the output of the EX-OR gate 807. The direction detection pulse 812a is an exclusive OR function of the $Q_2$ output 803c and the $Q_3$ output 803d of the shift register 803 and it is the output of the EX-OR gate 812. The count pulse 813a is an exclusive OR function of the $Q_3$ output signal 803d and the $Q_4$ output signal 803e of the shift register 803 and it is the output of the EX-OR gate 813. The output 808a is an exclusive OR function of the $Q_1$ output 803b of the shift register 803 and the output 807a of the EX-OR gate 807 and it is the output of the EX-OR gate 808. The EX-OR gate 809 is opened for the periods of the rises 213 and 215 and the rises 225 and 228 of the clock signal 204 in the fatched areas 891 and 892 to examine the logical value of the phase signal 104 at the phase B input terminal 802. The direction signal 400 is the output 805c of the D-flip-flop 805 and it is supplied to the up/down selection input terminal of the up/down counters 115a, 115b, 115c.

The operation of the circuit shown in FIG. 8A is explained with reference to FIG. 8B. The output signal 807a of the EX-OR gate 807 is an exclusive OR function of the $Q_1$ output 803b and the $Q_3$ output 803d of the shift register 803. The EX-OR gate 809 is opened in the periods of the rises 213 and 215 and the rises 225 and 228 of the clock signal 204 to examine the logical value of the phase B signal 104 at the rise and fall of the phase A signal 103. In the above periods, the EX-OR gate 809 exclusive-ORs the phase B signal 104, the $Q_1$ output 803b of the shift register 803 and the output 808a of the EX-OR gate 808 to produce rotation direction data, which is supplied to inverter 810 and then supplied to the data input terminal 805a of the D-flip-flop 805 through the OR gate 811. The output 812a of the EX-OR gate 812 which exclusive-ORs the $Q_2$ output 803c and the $Q_3$ output 803d of the shift register 803 is supplied to the clock input terminal 805b of the D-flip-flop 805 through the EX-OR gate 814 which prevents simultaneous rise of the direction detection pulse 813a from the EX-OR gate 813 and the direction detection pulse 819a from the shift register 804. At the rise 214 of the clock signal 812a, the direction signal 805c which is the Q output of the D-flip-flop 805 is set to "1", which is supplied to the up/down selection input terminal of the up/down counters 115a, 115b, 115c to set the up/down counters 115a, 115b, 115c to the count-up mode. At the rise 215 of the clock signal 204, the count pulse 813a which is the output of the EX-OR gate 813 rises by the exclusive OR function of the $Q_3$ output 803d and the $Q_4$ output 803e of the shift register 803, and it is supplied to the clock input terminal of the up/down counter 115a, 115b, 115c through the OR gate 815 which ORs the count pulse 813a and the count pulse 820a from the shift register 804 so that the up/down counters 115a, 115b, 115c is set to the count-up mode.

When the rotor rotates in the opposite direction, the EX-OR gate 809 examines the logical value of the phase B signal 104 at the rise and fall of the phase A signal 103 by the output 807a of the EX-OR gate 807. The direction detection pulse 812a which is the output of the EX-OR gate 812 is set to "0" so that the up/down counters 115a, 115b, 115c counts in the opposite direction, that is, it counts down. In the circuit of FIG. 8a, the shift register 804 examines the direction of rotation immediately before the counting for both and fall of the phase B signal 104. In FIG. 8B, when the direction of rotation is forward, the phase A signal 801a advances to the phase B signal 104 so that the output signal of the EX-OR gate 818 is opposite to the output signal of the EX-OR gate 809. It is "1" for the forward direction and "0" for the reverse direction and complies with the logic of the up/down selection of the up/down counters 115a, 115b, 115c. Accordingly, it need not be inverted by the inverter. Accordingly, the output 818a of the EX-OR gate 818 for examining the logical value of the phase A signal 801a is applied to the OR gate 811 as it is. The OR gate 811 functions to detect the direction of rotation at both the rise and the fall of the pulses of the phase A signal 103 and the phase B signal 802a.

In accordance with the present embodiment, the direction of rotation of the rotor is detected for each counting in both forward and reverse directions. The direction detection pulse 812a rises immediately before the counting to determine the direction, and the up/down counters 115a, 115b, 115c starts counting one period later than the clock signal 204 from the clock oscillator 821. Thus, if the frequency of the clock signal 821a is sufficiently higher than the frequency of rotation of the rotor, the rotation angle can be measured without error.

The direction signal 805c corresponds to the signal 400 shown in FIG. 4B, and the output 806c of the up/down counter 806 corresponds to the high resolution signal 401 shown in FIG. 4B.

The clock oscillator 821 may be shared by the clock pulse generator 122 shown in FIG. 4B.

The calibration value to be set from the memory 114 to the preset counters 115a, 115b and 115c is explained. As described above, the accumulated number $N_{inc}$ of the increment signals contained before the N-th transition point of the absolute signal is reached is represented by a formula (1). It is set to 200 and 315 at the 15th and 16th transition points of the absolute signal.

$$N_{inc} = N \cdot (N+1)/2 \ldots (1)$$

The absolute position $Z_N$ of the N-th transition point of the absolute signal is represented by a formula (2)

$$Z_N = N_{inc} \times \theta\min \ldots (2)$$

where $\theta$min is the resolution of the increment signal.

In the present embodiment, the counts of the preset counters 115a, 115b and 115c, that is, the count-up and count-down signal are the signal 401 which is four times as large as the increment signal. Thus, one increment signal causes four counts. Accordingly, the count included before the N-th transition point of the absolute signal is reached is represented by a formula (3).

$$\begin{aligned} N_C &= 4 \cdot N(N+1)/2 \\ &= 4 \cdot N_{inc} \end{aligned} \quad (3)$$

The absolute position to the count $N_C$ is equal to the formula (2) because the resolution of the count-up and count-down is given by $\theta$min/4.

The calibration value of the absolute position for the transition point of the absolute signal is given by the formula (3). For example, the calibration value for the fifth transition point of the absolute signal is "60" in decimal notation, and that for the sixth transition point is "84".

If the throttle valve 1105 further opens after the calibration at the sixth transition point of the absolute signal, the direction discriminator 123 outputs the signal 400 representing the count-up mode to the preset counters 115a, 115b and 115c. The counts of the preset counters 115a, 115b and 115c are incremented to 85, 86, ----- at each quarter of recording pitch λ. If the throttle valve moves toward the close position, the signal 400 represents the count-down mode and the counts are decremented to 83, 82, ----- at each quarter of the recording pitch λ.

Thus, by reading the counts of the preset counters 115a, 115b and 115c, the current absolute position can be precisely detected. The counts are outputted at the terminals 501–512.

When the increment signal is multiplied by k for use as the count-up and count-down inputs to the preset counters 115a, 115b and 115c, the calculation value $N_K$ for the N-th transition point of the absolute signal is given by a formula (4).

$$N_K = k \cdot N_{inc} \ldots \quad (4)$$

In the present embodiment, the numbers allotted to the transition points of the absolute signal, stored in the memory 114 are accumulated number of increment signal (for example, of phase A) before the transition point is reached. Since the preset counters 115a, 115b and 115c count at four times of the increment signal, the two low order bits of the preset counters 115a, 115b and 115c are set to L and the count in the memory 114 corresponding to the least significant bit of the calculation value supplied from the memory 114 at the third bit is multiplied by four and the product is set in the preset counters 115a, 115b and 115c. The formula (3) is rewritten as follows.

$$N_C = 2^2 \cdot N_{inc} \ldots \quad (5)$$

The count in the memory 114 may be the accumulated number of high resolution signals or signals counted by the present counters 115a, 115b and 115c before the transition point is reached. In this case, the bits of the memory and the bits of the preset counters 115a, 115b and 115c correspond to each other.

The concept of the present invention is not limited to the formulas (1)–(5). As described above, the transition points of the absolute signal may be selected in any manner so long as the interval between the transition points is an integer multiple of the number of high resolution signals. The transition points 15 and 16 of the absolute signal of the present embodiment are examples thereof.

In accordance with the formula (3), the calculation values at the transition points 15 and 16 are given by $$N_{15} = 4 \times 15 \times (15 + 1)/2$$
$$= 480$$
$$N_{16} = 4 \times 16 \times (16 + 1)/2$$
$$= 544$$

In the present embodiment, the calculation values at the transition points 15 and 16 are given by $$N_{15}' = 4 \times 200 = 800$$

$$N_{16}' = 4 \times 315 = 1260$$

In the present embodiment, $315 \times 4 = 1260$ increment signals are generated in the throttle valve range of 90 degrees.

Between the angles 0 degree and 30 degrees, 14 increment signals are generated in each 1 degree to interpolate the absolute signals. Accordingly, the number of increment signals in this section is $105 \times 4 = 420$. Between 30 degrees and 90 degrees, $(315 - 105) \times 4 = 840$ increment signals are generated. Accordingly, in this section, $840/60 = 14$ increment signals are generated in each 1 degree.

In the present embodiment, the detection angle is incremented or decremented by one degree at every 14 increment signals for each transition point.

The transition point is more frequently calibrated in the small aperture range (less than 30 degrees) of the throttle valve by the following reasons.

1) The calibration value of the initial position of the throttle valve is more quickly detected and set in the small aperture range. In this section, since the aperture information of the throttle valve materially affects to the control of fuel and other control of the engine, it is necessary to quickly detect the aperture 2) In the small aperture range of the throttle valve, it is not permitted that the count of the increment signals is miscounted. Accordingly, it is frequently calibrated by the absolute signals so that any error can be corrected at an early stage.

The present embodiment is particularly important when the sensor is used as an absolute type sensor without interpolation by the increment signals.

Where it is necessary to increase the detection resolution in a specific area of the small aperture range such as the throttle valve, it is important to generate the transition points of the absolute signals closely in the specific area. The absolute signal may be generated at an ununiform pitch by arranging the elements at an ununiform interval as is done in the present embodiment.

In the present embodiment, 14 transitional points of the absolute signal are generated at the ununiform pitch below 30 degrees, and only two transition points are generated above 30 degrees. In accordance with the present embodiment, the absolute signal may transit at 0.25 degree in the first section, and may transit at 0.75 degree in the second section.

Namely, the angle in each section may be $n(n+1)/2 \times \frac{1}{4}$, where n is an integer.

For example, when $n = 6$ (sixth section), $$(6 \times 7/2) \times (\tfrac{1}{4}) = 0.525 \text{ degrees},$$

and when $n = 14$, $$(14 \times 15/2) \times (\tfrac{1}{4}) = 26.65 \text{ degrees}.$$

The coefficient $\frac{1}{4}$ is selected to a lower limit of the detection power of the detection element. In the above example, the element capable of one quarter degree is used.

The coefficient may be modified depending on a resolution required by the controller.

The processing of the outputs of the preset counters 115a, 115b and 115c which represent the absolute positions is now explained.

Figure 9:
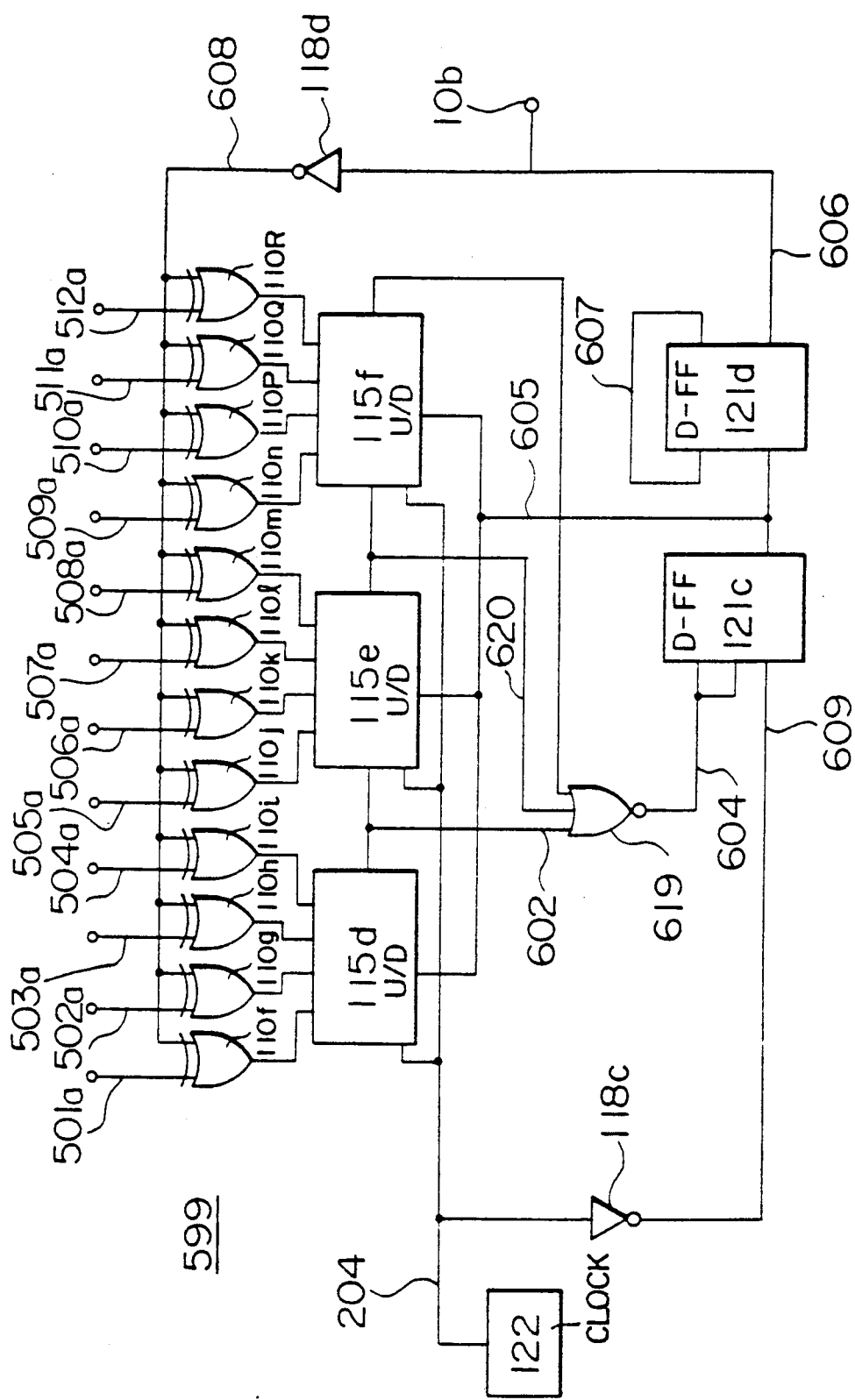
FIG. 9 shows a detail of a duty circuit.

In the present embodiment, the signals of the present counters 115a, 115b and 115c are processed by a pulse duty circuit 599. It is explained in detail with reference to FIGS. 9 and 10.

Absolute position outputs 501a-512a are applied to first inputs of EX-OR gates 110f-110R. Second inputs of the EX-OR gates 110f-110R receive a duty output inversion signal 608. Numeral 115d-115f denote preset up/down counters. In the duty circuit 599 they are used as down-counters.

When a clock signal 204 is applied to the up/down counters 115d-115f and the counters generate carries, an output of a NOR gate 619 (standard logic IC such as RCA CD4025) assumes H. This state is shown at a point a in FIG. 10. The carry signal 604 is applied to a data input terminal and a set signal terminal of the D-flip-flop 121c, and a preset signal 605 rises from the output terminal of the D-flip-flop 121c. The signal 605 also functions as a clock signal for the D-flip-flop 121d to invert the output 606. A duty output inversion signal is also inverted by an inverter 118d. Those are operations at the point a.

As the preset signal 605 rises, at least one of the carries of the counters 115d-115f disappears and the output 604 of the NOR gate 619 changes from H to L.

At a point a', a signal 609 derived from the clock signal 204 by inverting it by the inverter 118c is applied to the clock terminal of the D-flip-flop 121c so that the preset signal 605 changes from H to L and the outputs of the EX-OR gates 110f-110R are set to the counters 115d-115f. Since the first inputs 608 of the Ex-OR gates 110f-110R are L, the outputs 501-512a of the preset counters 115a-115c are set they are. The data set in the counters 115d-115f are decremented each time the clock signal is applied to the counters 115d-115f, and the carry signal 604 is generated by the clock signal shown at a point b in FIG. 10, as is done at the point a. The output 606 of the D-flip-flop 121d changes from H to L, and the duty output inversion signal 608 changes from L to H. At the point b', the outputs of the EX-OR gates 110f-110R are again set in the counters 115d-115f. Since the duty output inversion signal which is one input to the EX-OR gates 110f-110R is H, the inverted signals of the outputs 501a-512a of the preset counters 115a-115c are set in the counters 115d-115f. The signals set in the counters 115d-115f are decremented each time the clock signal 204 is applied to the counters 115d-115f, and a carry is generated at a point C shown in FIG. 10 to invert the signals. Then, the next data is set in the counters 115d-115f. Since the duty output inversion signal now L, the outputs 501a-512a are set as they are.

In the above operation, between the points a and b, the count of the 12-bit absolute position outputs 501a-512a produced by the counters 115d-115f represents the time, and between the points b and c, the remaining 12-bit count represents the time. Accordingly, the distance between the points a and c is always constant, and the point b changes depending on the states of the absolute position outputs 501a–512a. The output 606 of the D-flip-flop 121d is taken out through a signal line 10b to represent the aperture of the throttle valve 1105 by the duty signal having a period of the points a–c.

Since the aperture signal of the throttle valve 1105 is taken out by the single signal line 10b, the connection to the control unit 1107 shown in FIG. 12 is attained by three lines, a power supply line 10a to the signal processing circuit, a ground line and the signal line 10b.

In the present embodiment, the magneto-resistive elements are used although the present invention is applicable to a position detector by photo-electric elements.

Figure 25:
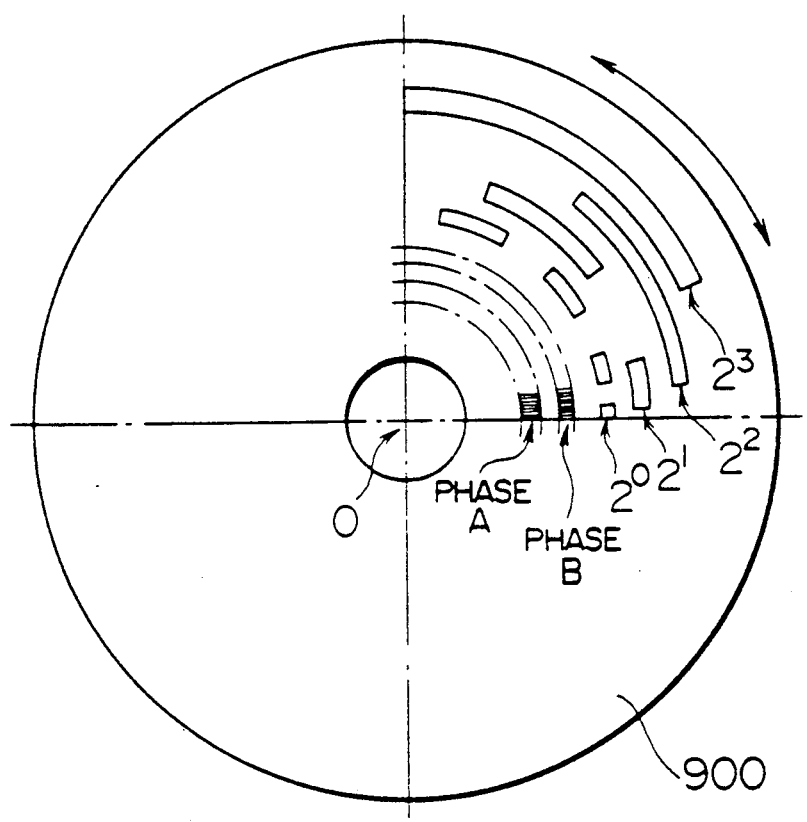
FIGS. 25 and 26 show embodiments which use photo-electric elements.
Figure 26:
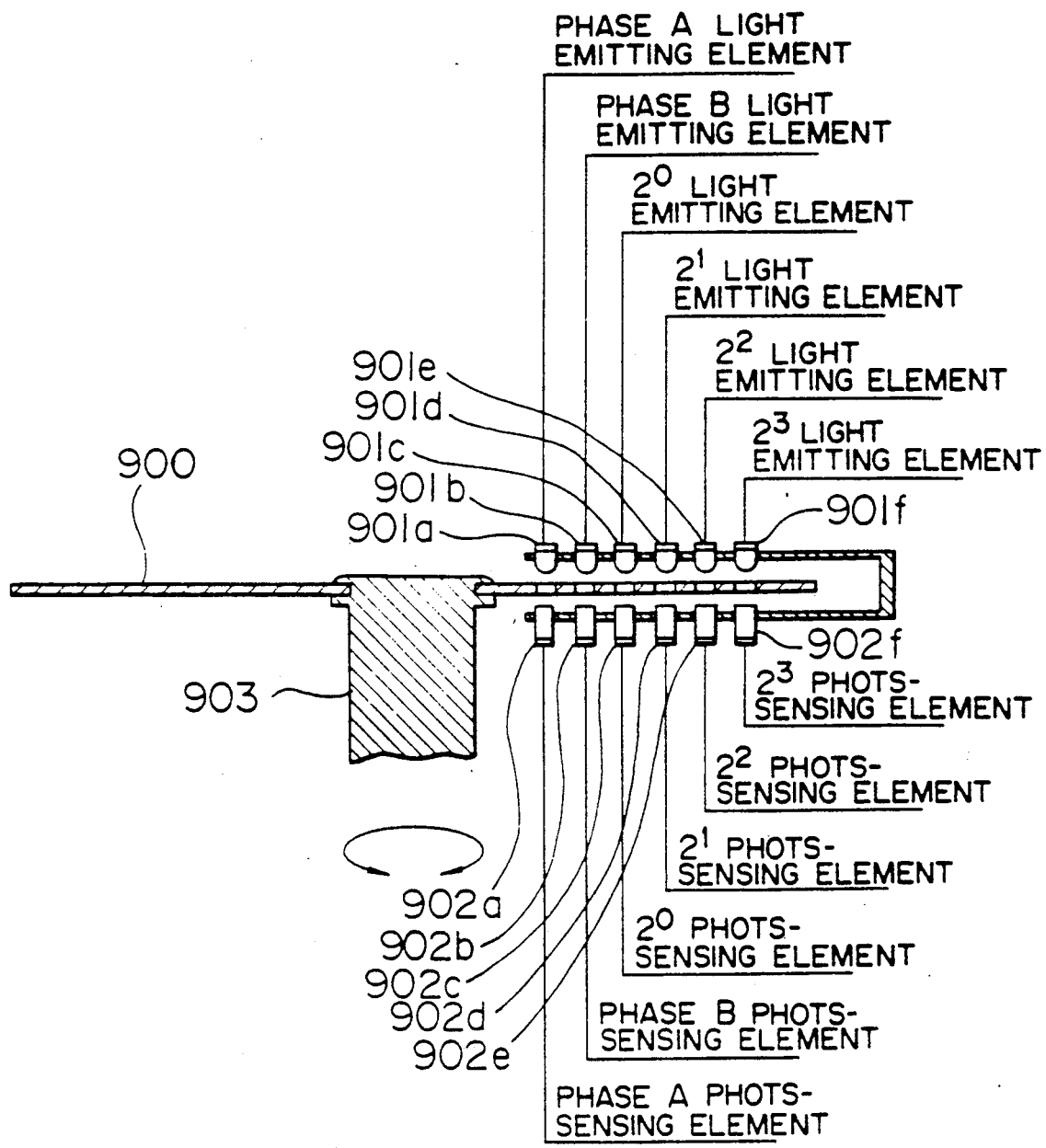

FIGS. 25 and 26 show an embodiment which uses photo-electric elements. The present embodiment is also applied to throttle sensor, and the number of increment signals contained below the N-th transition point of the absolute signal is set to $N(N+1)/2$. Slits for phase A, phase B, $2^0, 2^1, 2^2$ and $2^3$ are arranged in sequence on a slit disk 900 concentrically around a center of rotation 0.

Light emitting elements 901a–901f and photo-sensing elements 902a–902f are arranged on the opposite sides of the slits, and the absolute position is detected by the slits on the slit disk 900 which in union with a rotary shaft 903.

The signal processing circuit in the present embodiment uses both analog circuits and digital circuits. Those circuits may be integrated by currently available technique such as ASIC (application specified IC) so that it may be mounted in the angle detector.

The functions and advantages of the embodiments are summerized below.

(1) The transition in the absolute signal is detected, and the numeral (calculation value) allotted to the transition point is sent from the memory to the counters. The direction of rotation is detected to produce the up signal (increment) or down signal (decrement) to count up or down the high resolution signal.

(2) Even if the absolute signals are of the same data, the transition points of the data or the transition points of the absolute signal are different depending on whether the data is in the incremental mode or the decremental mode. Accordingly, the signal processing circuit which calibrates the absolute position with different values depending on the incremental mode and the decremental mode, even if the absolute signals are of the same data, is constructed with the memory, comparator, adder, presettable up/down counter and timing circuit.

(3) The transition points of the absolute signal are set at any points.

(4) The value set in the counters at the transition point of the absolute signal is the absolute position information for the transition point. This value is set in the counters at each transition point to calibrate the absolute position, and the number of high resolution signals are added or subtracted, depending on the direction of rotation, to or from the absolute position information set in the counter. Thus, the current absolute position is detected by the data in the counter with high resolution. Specifically, the value set in the counter is represented by the accummulated number of high resolution signals representing the angle between the origin point (initial position) and the transition point. Thus, the current absolute position is represented by the count in the counter and the high resolution detection of the absolute position is attained. Since the transition point of the absolute signal is generated by an integer multiple of the high resolution signals, the absolute position can be detected by using the counter.

(5) The change in the absolute signal is detected by the comparator, and when the change is in the incremental direction, the signal processing circuit provides the new absolute signal to the memory as the address. When the change is in the decremental direction, the new absolute signal is incremented by one by the adder and it is used as the memory address. In this manner, depending on whether the change in the absolute signal is in the incremental direction or decremental direction, different values are set in the presettable up/down counter to calibrate the absolute position. Thus, the absolute position can be exactly calibrated whichever the direction of change is.

(6) The transition points of the absolute signal may be set such that they are arranged at a lower pitch in a predetermined area than a uniform pitch. High frequency calibration may be attained by the transition points of low pitch and high precision detection area may be provided.

(7) The absolute position is detected at the transition point of the absolute signal and the absolute signal is detected by the high resolution signal until the next transition point is reached. Accordingly, the absolute signal is used to calibrate the absolute position and it may be of low pitch.

(8) In the throttle sensor of the present embodiment, when the throttle valve shaft rotates in the open or close direction of the throttle valve by the acceleration pedal, the sensor shaft rotates to follow the throttle valve shaft through the force transmission function of the lever provided at the end of the throttle valve shaft and the sensor shaft or the return spring action. This rotation angle is detected by coaction of the magnetic drum and the magnetic detector so that the throttle valve aperture is detected. In the sensor of the present invention, since the throttle valve shaft and the sensor shaft are separately constructed and coupled by the lever, the mechanical vibrations generated axially and radially of the throttle valve shaft are absorbed by the engagement surfaces of the lever, and the mechanical vibrations are prevented from being transmitted to the sensor shaft. Thus, only the rotational force of the throttle valve shaft is transmitted to the sensor shaft. As a result, the relative positions of the magnetic drum provided on the sensor shaft and opposing magnetic detector are kept constant and the reduction of the detection precision is prevented. Since the throttle sensor comprises the sensor shaft which is separate from the throttle valve shaft, the bearing for supporting the sensor shaft, the magnetic drum and the sensor assembly having the sensor elements such as the magnetic detector, the relative positions of the magnetic drum and the magnetic detector can be set in the manufacturing process of the sensor. Accordingly, it is not necessary to adjust the relative positions of the magnetic drum and the magnetic detector when the sensor is mounted, and the sensor mounting work is simplified.

Preferred operation modes of the present invention are recited below.

(1) An angle detector having an absolute signal consisting, of one or more bit and one or more increment signal between transition points of the absolute signal, detects the transition points of the absolute signal, calibrates an absolute position by a numeral allotted to the transition point, and adds or subtracts the number of high resolution signals to or from the numeral allotted to the transition point to detect the absolute position.

(2) An angle detector according to (1) above has the calibration circuit which detects whether the change in the absolute signal is in the incremental or decremental direction, and calibrates the absolute position by different numeral for the same data of the absolute signal depending on the direction of the change.

(3) An angle detector according to (1) above in which the numeral allotted to the transition point is the accumulated number of high resolution signals representing the angle of the transition point of the absolute signal.

(4) An angle detector according to (1) in which the length between two transition points of the absolute signal is different from other length between other two transition points, and the lengths between the transition points are integer multiples of the number of high resolution signals.

(5) An angle detector according to (2) above in which the calibration circuit comprises the memory, comparator, adder, presettable up/down counter and timing circuit for controlling the calibration circuit.

(6) An angle detector according to (5) above in which the calibration circuit detects the change in the absolute signal in the incremental or decremental direction. If it is in the incremental direction, provides the current value of the absolute signal to the memory as the address. If it is in the decremental direction, it increments the current value by one and provides it to the memory as the address. The memory sends to the transition point corresponding to the address to the presettable up/down counter to calibrate the absolute position.

(7) An angle detector according to (5) above has an absolute position detector which supplies a direction discrimination signal to the presettable up/down counter to count up or down the high resolution signals by the presettable up/down counter.

(8) An angle detector according to (7) above has an output processing circuit which produces the absolute position signal supplied from the absolute position detector as the duty output.

(9) An angle detector according to (5) above in which the calculation circuit multiplies the numeral allotted to the transition point of the absolute signal by $2^n$ (n=1, 2, 3, ----) and supplies the product to the presettable up/down counter.

(10) An angle detector according to (1) above has an initialization circuit which causes the calibration circuit, the absolute position detector and the output processing circuit to generate pulse signals a predetermined time after the supply of power and activates the calibration circuit which the change in the absolute signal does not occur.

(11) An angle detector has a case which houses the signal generation member for generating a signal in accordance with the rotation angle of the rotor, the detection member for detecting the signal of the signal generation member and the signal processing circuit of (1)-(10) above.

(12) An angle detector according to (11) above in which the signal generation member is magnetic material and the detection member is a magneto-resistive element.

(13) An angle detector according to (11) above in which the signal generation member is a slit disk and the detection member a photo-electric element.

(14) A throttle sensor for detecting the aperture of the throttle valve fixed to the throttle valve shaft of the internal combustion engine by magnetic detection means comprises the sensor shaft formed separately from the throttle valve shaft, the bearing for rotatably supporting the sensor shaft, the return spring for biasing the sensor shaft in the closing direction of the throttle valve, the magnetic drum fixed to the sensor shaft for detecting the aperture of the throttle value, and the single sensor assembly having the magnetic detection element mounted therein for detecting the magnetic change in the rotation of the magnetic drum, arranged to face the magnetized surface of the magnetic drum. The sensor assembly arranged near one end of the throttle valve shaft, and levers are provided at the ends of the sensor shaft and the throttle valve shaft. The sensor shaft responds to the rotation of the throttle valve shaft by the engagement of lever and the return spring force.

(15) A throttle sensor according to (14) above in which the sensor shaft is supported at two points by the two bearings which are bound for radial and axial movements.

(16) A throttle sensor according to (14) or (15) above in which the magnetized surface of the magnetic drum is formed on the outer periphery of the drum and the magnetic detection element is arranged on the outer periphery of the magnetic drum with the support member being interposed.

(17) A throttle sensor according to (16) above in which the support member has the magnetic detection element arranged on one side thereof and the signal processing circuit for producing the rotation angle signal in accordance with the signal detected by the magnetic detection element, arranged on the other side thereof, and the magnetic detection element and the signal processing circuit are electrically connected by the conductors extending through the support member.

(18) A throttle sensor according to (16) above in which the support member has the gap adjusting mechanism which rotates around the support point to adjust the gap between the magnetic drum and the magnetic detection element.

As described above, in accordance with the present invention, (1) the angle detector which can detect the absolute position at the high resolution of the high resolution signal by the small-bit absolute signal and the high resolution signal is provided, and (2) the absolute position is detected by the small bit signal with the high resolution, and the size, weight and cost are reduced.

We claim:

1. An angle detector for producing an absolute signal representing a rotation angle of a rotor, comprising:
 means for generating a plurality of absolute signals in a measurement range with at least one of said plurality of absolute signals representing at least one specific angle, wherein the interval of the absolute signals in a specific measurement range is smaller than in another measurement range;

means for sequentially generating increment signals at a predetermined interval in accordance with the rotation of the rotor in measurement ranges above and below the specific angle; and means for adding or subtracting the increment signals to or from the at least one absolute signal representing said specific angle to produce the absolute signal representing the rotation angle of the rotor.

2. An angle detector for producing an absolute signal representing a rotation angle of a rotor, comprising:

means for generating a plurality of absolute signals in a measurement range with at least one of said plurality of absolute signals representing at least one specific angle and being generated near an initial position of the rotor, wherein the interval of the absolute signals in a specific measurement range is smaller than in another measurement range;

means for sequentially generating increment signals at a predetermined interval in accordance with the rotation of the rotor in measurement ranges above and below the specific angle; and means for adding or subtracting the increment signals to or from the at least one absolute signal representing said specific angle to produce the absolute signal representing the rotation angle of the rotor.

3. An angle detector for producing an absolute signal representing a rotation angle of a rotor, comprising:

means for generating an absolute signal representing at least one specific angle in a measurement range;

means for discriminating a direction of rotation of the rotor;

means for generating increment signals at a predetermined interval in accordance with the rotation of the rotor over the measurement range; and means for adding or subtracting the increment signals to or from the absolute signal representing said specific angle depending on the direction of rotation discriminated by said discrimination means to correct the absolute signal.

4. An angle detector according to claim 3, wherein said corrected absolute signal represents the rotation angle of the rotor and said corrected absolute signal is continuously produced regardless of the position of said rotor.

5. An angle detector for producing an absolute signal representing a rotation angle of a rotor, comprising:

means for generating an absolute signal representing at least one specific angle in a measurement range;

means for sequentially generating increment signals at a predetermined interval in accordance with the rotation of the rotor in measurement ranges above and below the specific angle; and means for adding or subtracting the increment signals to or from the absolute signal representing said specific angle to produce the absolute signal representing the rotation angle of the rotor, wherein said absolute signal representing the rotation angle of the rotor is continuosly produced regardless of the position of said rotor.

6. An angle detector for producing an absolute signal representing a rotation angle of a rotor, comprising:

means for generating a binary coded signal representing at least one specific angle in a measurement range;

means for sequentially generating increment signals at a predetermined interval in accordance with the rotation of the rotor in measurement ranges above and below the specific angle;

means for counting the number of increment signals;

means for adding or subtracting the count of the increment signals to or from the binary coded signal; and means for producing the sum or difference signal as a binary coded signal representing the absolute value of the rotation angle of the rotor, wherein said binary coded signal representing the absolute value of the rotation angle of the rotor is continuously reproduced regardless of the position of said rotor.

7. An angle detector for detecting a rotation angle of a rotor, comprising:

means for generating a binary coded signal at each of division points in a measurement range;

means for generating small section signals at a predetermined interval between specific binary coded signals;

means for weighting the binary coded signal by angles; and means for adding or subtracting the small section signals to or from the weighted signal to produce an absolute signal which interpolates two binary coded signals, wherein said absolute signal which interpolates two binary coded signals represents the rotation angle of the rotor and is continuously produced regardless of the position of said rotor.

8. An angle detector for producing an absolute signal representing a rotation angle of a rotor, comprising:

means for generating an absolute signal representing at least one specific angle in a measurement range;

means for sequentially generating increment signals at a predetermined interval in accordance with the rotation of the rotor in measurement ranges above and below the specific angle; and means for adding or subtracting the increment signals to or from the absolute signal representing said specific angle to produce the absolute signal representing the rotation angle of the rotor, wherein a plurality of absolute signals are generated in the measurement range, each said absolute signal corresponding to a different section of the measurement range, whereby the interval of the absolute signal in a specific section of said measurement range is smaller than that in any other section of said measurement range.

9. An angle detector for producing an absolute representing a rotation angle of a rotor, comprising:

means for generating an absolute signal representing at least one specific angle in a measurement range, wherein the absolute signal representing said specific angle is generated near an initial position of the rotor;

means for sequentially generating increment signals at a predetermined interval in accordance with the rotation of the rotor in measurement ranges above and below the specific angle; and means for adding or subtracting the increment signals to or from the absolute signal representing said specific angle to produce the absolute signal representing the rotation angle of the rotor, wherein a plurality of absolute signals are generated in the measurement range, each said absolute signal corresponding to a different section of the measurement range, whereby the interval of the absolute signal in a specific section of said measurement range is smaller than that in any other section of said measurement range.

* * * * *

UNITED STATES PATENT AND TRADEMARK OFFICE
CERTIFICATE OF CORRECTION

PATENT NO. : 5,012,673
DATED : May 7, 1991
INVENTOR(S) : Yoshiya Takano, Yoshikazu Hoshi It is certified that error appears in the above-identified patent and that said Letters Patent is hereby corrected as shown below:

On the Title Page, left-hand column, under the heading "[30] Foreign Application Priority Data", the first Japanese application filing date of "April 30, 1987" should be deleted and insert therefor -- April 3, 1987 --.

Signed and Sealed this

Twenty-second Day of June, 1993

Attest:

MICHAEL K. KIRK

Attesting Officer *Acting Commissioner of Patents and Trademarks*